(12) United States Patent
Rich et al.

(10) Patent No.: US 6,817,000 B2
(45) Date of Patent: Nov. 9, 2004

(54) DELAY CORRELATION ANALYSIS AND REPRESENTATION FOR VITAL COMPLAINT VHDL MODELS

(75) Inventors: Marvin J. Rich, Poughkeepsie, NY (US); Ashutosh Misra, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 197 days.

(21) Appl. No.: 10/038,209

(22) Filed: Jan. 2, 2002

(65) Prior Publication Data

US 2003/0126569 A1 Jul. 3, 2003

(51) Int. Cl.[7] .............................................. G06F 17/50
(52) U.S. Cl. ............................. 716/6; 703/14; 703/19
(58) Field of Search ............................... 716/6; 703/14, 703/19

(56) References Cited

U.S. PATENT DOCUMENTS

| | | | |
|---|---|---|---|
| 5,581,738 A | | 12/1996 | Dombrowski |
| 5,870,309 A | | 2/1999 | Lawman |
| 5,875,111 A | * | 2/1999 | Patel ........................... 703/19 |
| 5,886,900 A | | 3/1999 | Gascoyne et al. |
| 5,889,685 A | | 3/1999 | Ramachandran |
| 5,933,356 A | | 8/1999 | Rostoker et al. |
| 5,949,983 A | | 9/1999 | Baxter |
| 6,018,624 A | | 1/2000 | Baxter |
| 6,038,384 A | | 3/2000 | Ehrler |
| 6,053,947 A | | 4/2000 | Parson |
| 6,134,705 A | | 10/2000 | Pedersen et al. |
| 2003/0125917 A1 | * | 7/2003 | Rich et al. ..................... 703/14 |
| 2003/0125918 A1 | * | 7/2003 | Rich et al. ..................... 703/14 |

OTHER PUBLICATIONS

Fleischmann et al., OLIVIA: Objectoriented Logicsimulation Implementing the VITAL Standard, Proceedings of the Seventh Great Lakes Symposium on VLSI, pp. 51–56, Mar. 1997.*

Balaji et al, Modeling ASIC Memories in VHDL, Proceedings of the Conference with EURO–VHDL '96 and Exhibition on European Design Automation, pp. 502–508, Sep. 1996.*

S. Krolikoski, Standardizing ASIC Libraries in VHDL Using VITAL: A Tutorial, IEEE 1995 Custom Integrated Circuits Conference, pp. 603–610, May 1995.*

* cited by examiner

*Primary Examiner*—A. M. Thompson
(74) *Attorney, Agent, or Firm*—Lawrence D. Cutter; Jose Gutman; Fleit, Kain, Gibbons, Gutman, Bongini & Bianco P.L.

(57) ABSTRACT

A method and system unbind a rise/fall tuple of a VHDL generic variable and create rise time and fall time generics of each generic variable that are independent of each other. Then, according to a predetermined correlation policy, the method and system collect delay values in a VHDL standard delay file, sort the delay values, remove duplicate delay values, group the delay values into correlation sets, and output an analysis file. The correlation policy may include collecting all generic variables in a VHDL standard delay file, selecting each generic variable, and performing reductions on the set of delay values associated with each selected generic variable.

41 Claims, 22 Drawing Sheets

1200

| CHAR POSITION (0 OFFSET) | CHAR VALUE | Correlation Set (x') | Entry Position (y') | Slot Offset (x") |
|---|---|---|---|---|
| 0 | 1 | N/A | N/A | N/A |
| 1 | 4 | 1 | 5th | 1st |
| 2 | X | 1 | 60th | 2nd |
| 3 | a | 1 | 11th | 3rd |
| 4 | m | 1 | 26th | 4th |
| 5 | p | 1 | 29th | 5th |
| 6 | l | 1 | 25th | 6th |

*FIG 12* tpd_A positions for AND2 gate

Encode as:

DELAY        tpd_A

| DELAY | 1 | 2 | 3 |
|---|---|---|---|
| -0.500 ns | 0 | 0 | 0 |
| -0.499 ns | 0 | 0 | 1 |
| • • | • • | • • | • • |
| +237.826 ns | Z | Z | Y |
| +237.827 ns | Z | Z | Z |

DELAY CORRELATION ANALYSIS AND REPRESENTATION FOR VITAL COMPLAINT VHDL MODELS

CROSS-REFERENCE TO RELATED APPLICATIONS

The present patent application is related to and commonly owned U.S. patent application Ser. No. 10/038,311, entitled "Size Reduction Techniques for VITAL Compliant VHDL Simulation Models", now U.S. Patent Application Publication No. US 2003/0125917 A1. and U.S. patent application Ser. No. 10/038,689, entitled "VHDL Technology Library Method for Efficient Customization of Chip Gate Delay Characteristics", now U.S. Patent Application Publication No. US 2003/0125918 A1, filed on even date with the present patent application, the entire teachings of which being hereby incorporated by reference.

This invention was made with government support under subcontract B338307 under prime contract W-7405-ENG-48 awarded by the Department of Energy. The Government has certain rights in this invention.

BACKGROUND OF THE INVENTION

1. Field of the Invention

This invention generally relates to the field of VHDL modeling, and more particularly relates to a system and method for analyzing, correlating, and representing delays within a VITAL compliant VHDL Model.

2. Description of Related Art

As ASICs (Application Specific Integrated Circuits) have become more complex, emphasis on verification techniques have flourished to assure that a particular ASIC's functionality can be verified prior to manufacture. One of the efforts is the IEEE VITAL (VHDL Initiative Towards ASIC Libraries) standard that allows back annotation of timing data into a simulation model. Part of this standard also defines the methodology required to generate VITAL compliant models. The VITAL standard provides the capability of generating very sophisticated behaviourals of circuit behavior, which incorporate time delays (as determined by other timing tools).

Usually models of this type have the most meaning at the gate level, where a model is synthesized into gates associated with a particular technology. The provider of the technology usually provides a set of VITAL compliant VHDL models for the gates, such that a very detailed behavior of the ASIC can be simulated. An event driven simulator is usually utilized with VITAL compliant models. During model load time, the SDF (Standard Delay Format file) is also read in to initialize a set of VHDL (Very High Speed Integrated Circuit Hardware Design Language) generic variables with the delay values. A naming convention exists for mapping SDF delay constructs to VHDL generic delay variable names, which is the basis of how the delays are back annotated. Due to the detail of the modeling, this type of simulation is most useful for going after specific scenarios where other simulation environments may be less accurate (i.e., clock gating, test logic, asynchronous boundaries, array controls, etc.).

Previously, delays have always been defined as tightly bound tuples of rise and fall times. For example, the generic variable tpd_A is defined as $$tpd\_A = (\text{rise time, fall time}).$$

Because the elements of the tuple are so linked, it is very difficult to correlate delay values. For a distribution range from 0 ns to 0.999 ns, in 1 ps increments, there could be a 1 in one million probability of finding another gate with the same rise and fall time (1000 possibilities for rise time×1000 possibilities for fall time). That probability is for just a single delay within a gate. The possibility is even more remote for a match of all delay tuples for a given gate type. For a uniform distribution, the probability would be $(1/10^6)^n$ where n=the number of delays for the gate. A common two-input AND gate, AND2_LOW, for example, contains 6 different delays. So, the odds of matching all delays of any two AND gates would be 1 in $10^{6 \times n}$, or 1 in $10^{36}$. This is a worst-case analysis, but demonstrates the magnitude of how remote the possibility is of obtaining delay correlations.

This process of binding each delay as a tuple imposes restrictions upon the SDF file. Because each delay much be represented in the SDF file, and the probability of obtaining a match between any two delay tuples is so small, the SDF file becomes extremely large. Even with this size penalty, it is still desirable to simulate a chip in this environment because it most accurately models the chip operation prior to fabrication. Also event simulation, with delays, can accurately model logic implementations that are resistant to other simulation environments, such as cycle simulation. Therefore any mechanism that may allow for the reduction of this type of model, in terms of space or time, is desirable in order to enhance the ability of the model to fit on a host computer platform, or to complete a simulation in a timely manner such that the detailed simulation capabilities provided by VITAL compliant VHDL event simulation may be exploited. A reduction in the size of the model requires less memory in order to store and execute the file. Also, if the reduction is great enough, it could allow the entire model to be stored in RAM (Random Access Memory) memory instead of having to dynamically swap in and out portions of the model from a secondary storage medium such as a hard drive. This would decrease the number of reads from a hard drive during a simulation, which would greatly reduce the simulation time.

The decrease in memory requirements and the runtime decrease could also provide for the simulation to be performed on a lower cost computing system than would normally be required. The necessary computing system could contain less memory and a slower processor, therefore providing a cost savings.

Therefore a need exists to overcome the problems with the prior art as discussed above, and particularly for a method of reducing the size of VITAL compliant VHDL models.

SUMMARY OF THE INVENTION

A method and system unbind a rise/fall tuple of a VHDL generic variable and create rise time and fall time generics of each generic variable that are independent of each other. Then, according to a predetermined correlation policy, the method and system collect delay values in a VHDL standard delay file, sort the delay values, remove duplicate delay values, group the delay values into correlation sets, and output an analysis file. The correlation policy may include collecting all generic variables in a VHDL standard delay file, selecting each generic variable, and performing reductions on the set of delay values associated with each selected generic variable.

BRIEF DESCRIPTION OF THE DRAWINGS

FIG. 12 is a table illustrating exemplary decode values of a unique AND2_MED logic gate for the system of FIG. 1, according to a preferred embodiment of the present invention.

DESCRIPTION OF THE PREFERRED EMBODIMENTS

The present invention, according to a preferred embodiment, overcomes problems with the prior art by providing a unique process that unbinds the rise/fall tuples from the generic variable name, thereby enabling other methods to reduce the size of a VITAL compliant VHDL simulation model. The simulation model reduction is achieved through the significant reduction in size of the SDF file required to back annotate delay values into the model. The reduced size results in significantly reduced memory requirements for a computing system. This reduces costs of the overall computer system required for simulation. The use of this process also has the effect of increasing performance on the computer platform that is host to the simulation model, due to reduced memory paging requirements and reduced file I/O.

Exemplary embodiments disclosed are for a model written in VHDL, but similar techniques may also be applied to simulation models written in the Verilog language. The techniques involve editing the VHDL model or its associated SDF, based on size reduction observations, to realize a savings in the size of the resulting simulation model.

The SDF size reduction is based on the correlation of disparate delay values, whose scope in prior art was limited to a single instance of a logic gate. These correlated values will tend to cluster around technology dependent values, such that the same delays can be reused regardless of the chip size. This provides the advantage that the SDF size reduction utilizing this technique, will scale well with increased chip size, resulting in a larger percentage size reduction for the larger, and more problematic, chip sizes. All improvements utilize techniques that maintain compliance to the VITAL standard. This has the advantage of allowing any simulation platform that already implements the VITAL standard to easily incorporate this mechanism into its technology library in order to gain the benefits of this invention.

Figure 1:
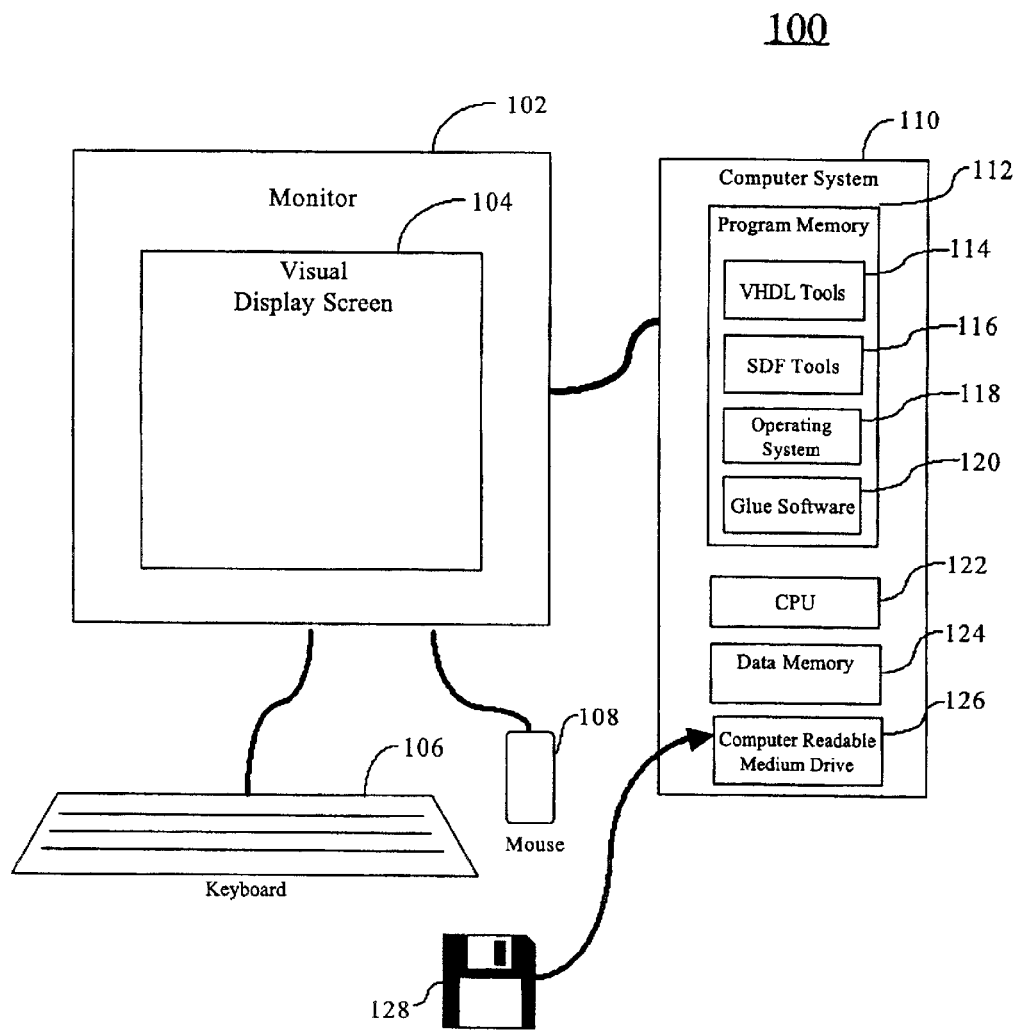
FIG. 1 is a block diagram illustrating a VHDL modeling system in accordance with a preferred embodiment of the present invention.
Figure 2:
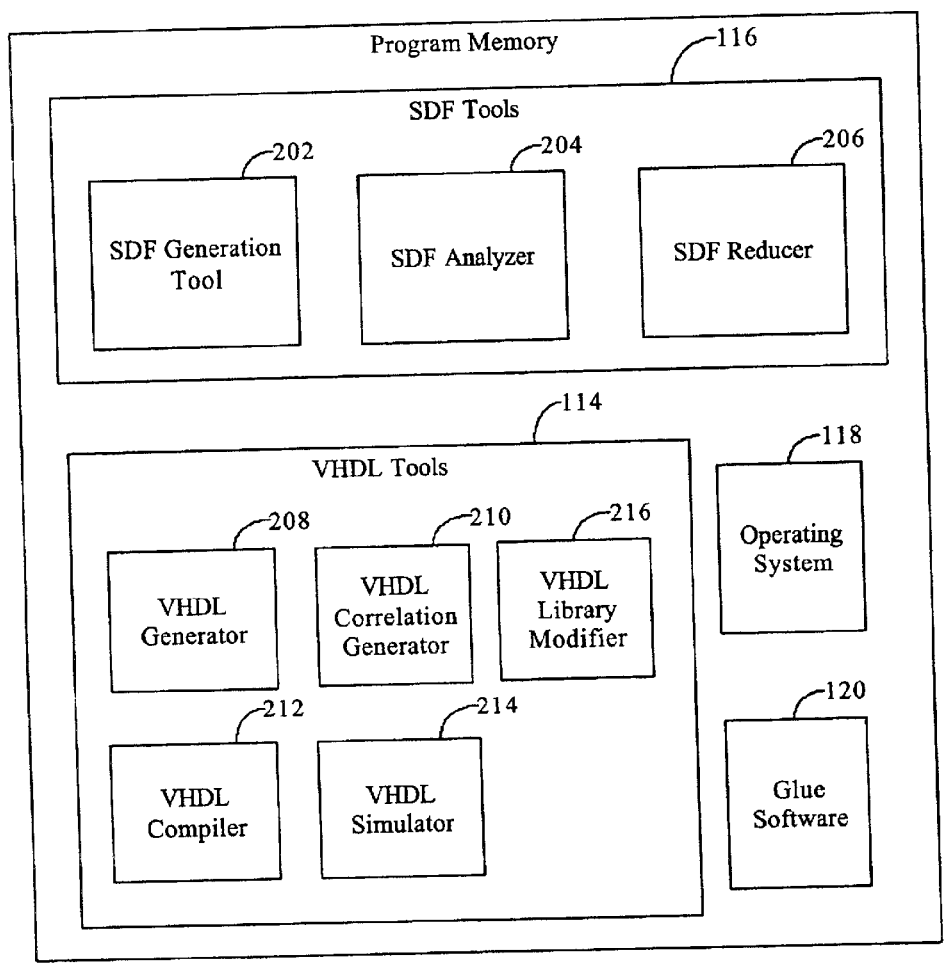
FIG. 2 is a more detailed block diagram showing a program memory in the system of FIG. 1, according to a preferred embodiment of the present invention.

FIGS. 1 and 2 illustrate an exemplary VHDL modeling system according to a preferred embodiment of the present invention. The VHDL modeling system 100 includes a computer system 110, having VHDL tools 114 and SDF tools 116. The computer system 110, according to the present example, includes a controller/processor 122, which processes instructions, performs calculations, and manages the flow of information through the computer system 110. Additionally, the controller/processor 122 is communicatively coupled with program memory 112. Included within program memory 112 are VHDL tools 114 and SDF tools 116 (which will be discussed in later in greater detail), operating system platform 118, and glue software 120. The VHDL tools 114 contain a VHDL generator 208, a VHDL correlation generator 210, a VHDL compiler 212, a VHDL simulator 214 and a VHDL Library Modifier 216. The SDF tools 116 consist of an SDF generation tool 202, an SDF analyzer 204, and an SDF reducer 206. The operating system platform 118 manages resources, such as the data stored in data memory 124, the scheduling of tasks, and processes the operation of the VHDL tools 114 and the SDF tools 116 in the program memory 112. The operating system platform 118 also manages a graphical display interface (not shown), a user input interface (not shown) that receives inputs from the keyboard 106 and the mouse 108, and communication network interfaces (not shown) for communicating with a network link (not shown). Additionally, the operating system platform 118 also manages many other basic tasks of the computer system 110 in a manner well known to those of ordinary skill in the art.

Glue software 120 may include drivers, stacks, and low level application programming interfaces (API's) and provides basic functional components for use by the operating system platform 118 and by compatible applications that run on the operating system platform 118 for managing communications with resources and processes in the computing system 110.

Each computer system 110 may include, inter alia, one or more computers and at least a computer readable medium 128. The computers preferably include means 126 for reading and/or writing to the computer readable medium 128. The computer readable medium 128 allows a computer system 110 to read data, instructions, messages or message packets, and other computer readable information from the computer readable medium. The computer readable medium, for example, may include non-volatile memory, such as Floppy, ROM, Flash memory, disk drive memory, CD-ROM, and other permanent storage. It is useful, for example, for transporting information, such as data and computer instructions, between computer systems.

Figure 3:
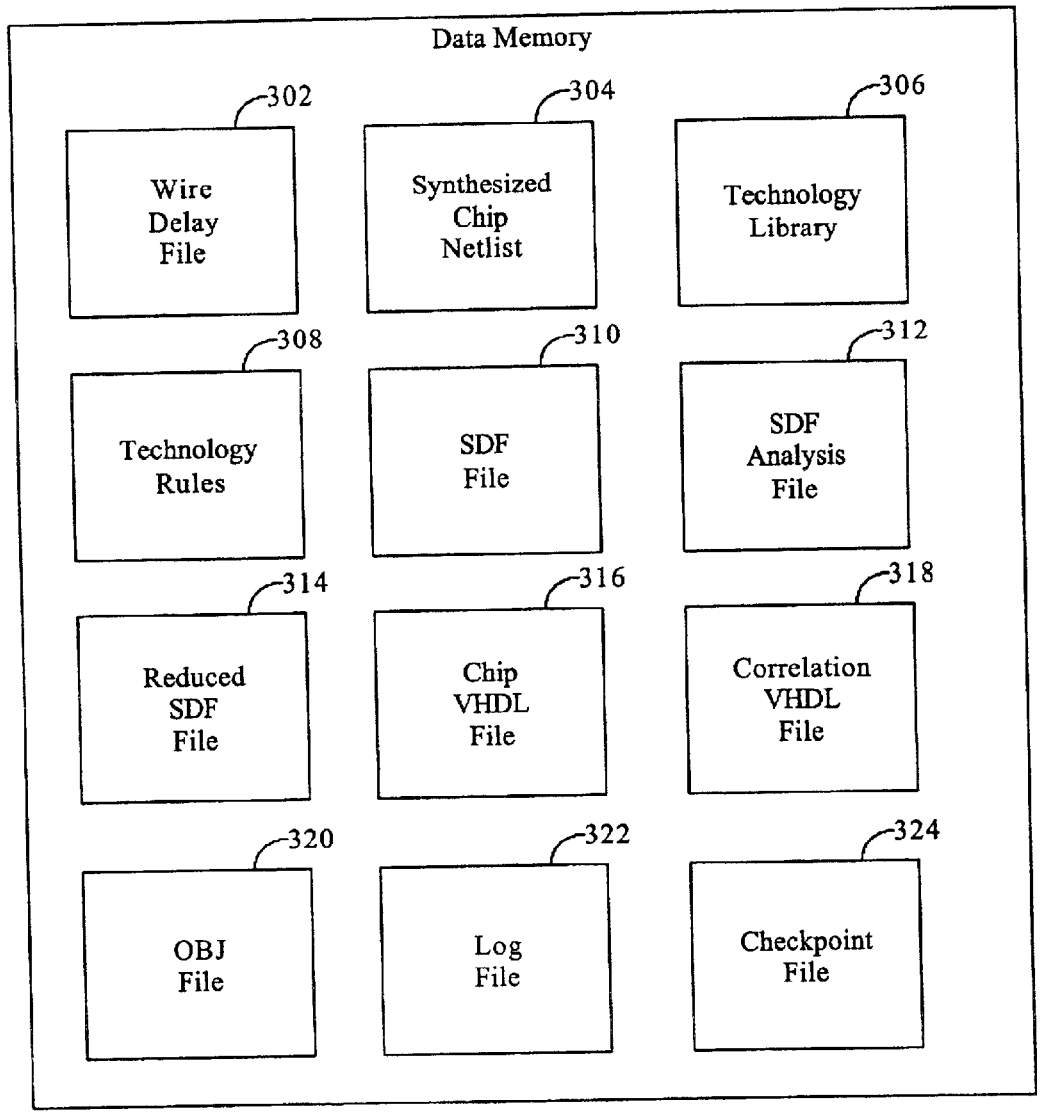
FIG. 3 is a more detailed block diagram of a data memory in the system of FIG. 1, according to a preferred embodiment of the present invention.

FIG. 3 illustrates a preferred embodiment of the data memory 124 of the VHDL modeling system 100 of FIG. 1. Data memory 124 includes a wire delay file 302, a synthesized chip netlist 304, a technology library 306 and technology rules 308. The wire delay file 302 is usually derived after physical gate layout and contains the physical wire delay information (rise and fall RC time constants and load capacitance) that influences external gate delays (e.g. gate connection). The synthesized chip netlist 304 is the resulting file after the logical representation of a chip has been synthesized into an equivalent gate level representation for a target technology. A target technology represents a chip manufacturing process that provides a defined chip density and performance level (e.g. CMOS7S 0.18 micron technology from IBM Corporation). The technology library 306 is a file, independent of the chip, which describes the topology (e.g. number of inputs, names, number of outputs, etc.) of each gate for a target technology. The technology rules 308, also independent of the chip, contain detailed delay information associated with the internal operation of each logic gate.

The data memory 124 also contains an SDF (Standard Delay Format) file 310, an SDF analysis file 312, and a reduced SDF file 314. The SDF (Standard Delay Format) file 310 is an industry standard (IEEE 1076.4) file that specifies delays in a format for simulation tools to back annotate timing delays and is created by the SDF generation tool 202. The SDF analysis file 312 is output by the SDF analyzer 204 and can be used to determine delays used for each VHDL generic or to determine delays associated with each instance of a logic gate. The reduced SDF file 314 is a file output by the SDF reducer 206 and contains only two generics per instance of each logic gate.

Also contained in data memory 124 are a chip VHDL file 316, a correlation VHDL file 318, and an object file 320. The chip VHDL file 316 is a file output by the VHDL generator 208 for use by a VHDL event simulator 214. The correlation VHDL file 318 has correlation delay information embedded within the file, and the object file 320 contains the machine language executables used to simulate the chip on a particular workstation platform (e.g. Windows, Unix, etc.) The data memory 124 may optionally contain files such as a log file 322 and a checkpoint file 324 to save the current state of a simulation.

Figure 4:
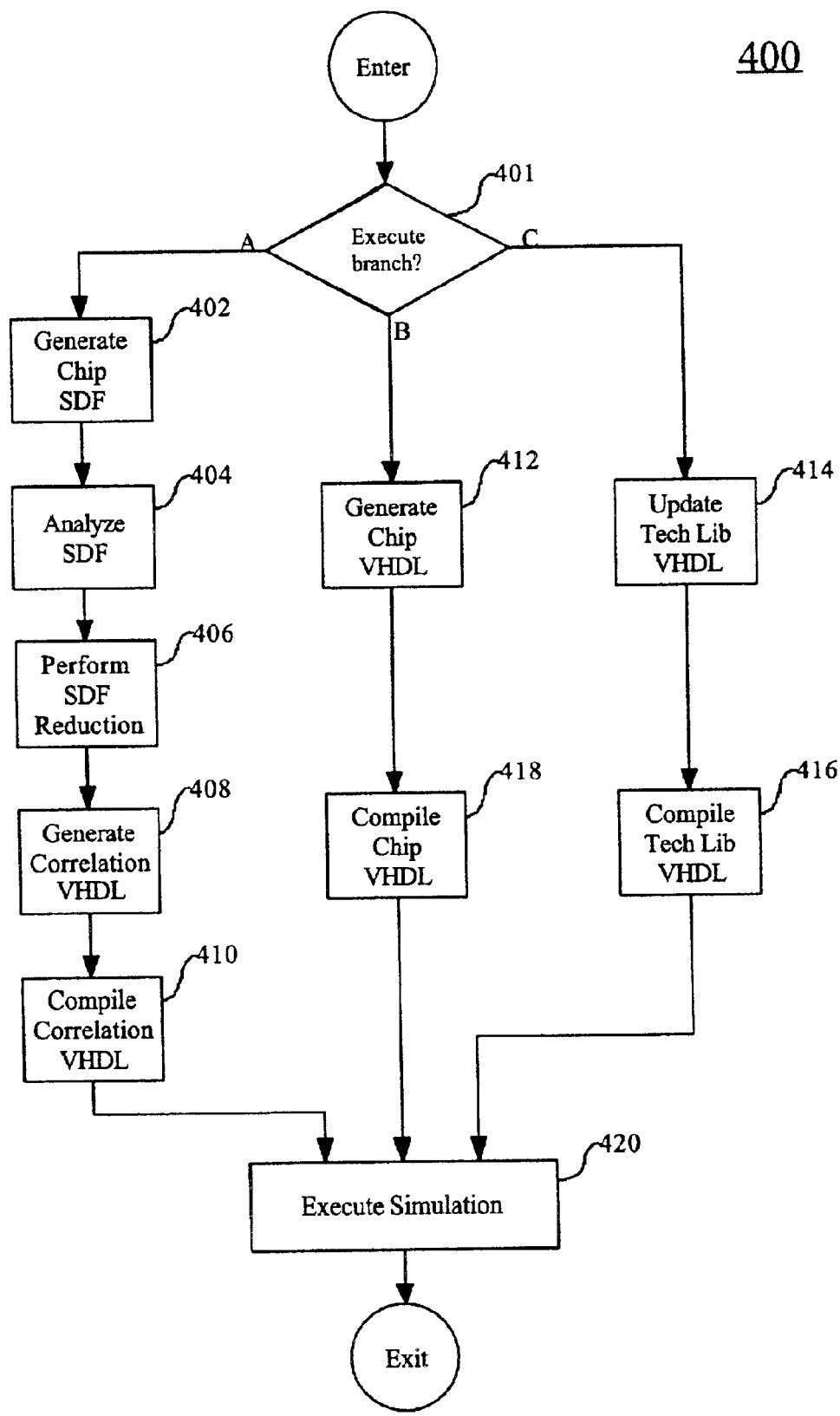
FIG. 4 is an operational flow diagram illustrating an exemplary operational sequence for the system of FIG. 1, according to a preferred embodiment of the present invention.

FIG. 4 is an exemplary operational flow diagram illustrating the overall process of preparing a chip netlist for VHDL simulation for the system of FIG. 1. The system enters the process, at step 401, where the decision is made as to which path to execute. Path A performs the steps necessary to analyze and correlate gate delays to realize the SDF size reductions as specified in this invention. Path B performs a traditional chip VHDL compile, using prior art methods. Path C involves the alteration of the technology library to accommodate a reduced SDF delay specification format as specified in this invention. Each of these paths can be executed independently, until all paths converge, at step 420. Paths A and B are executed for each chip simulation iteration. Path C is executed only once for the target technology in which the chip will be manufactured.

If path "A" is chosen, the process proceeds, at step 402, to create an SDF file 310 for a given synthesized chip netlist 304. The processing, at step 402, involves prior art methods as specified in the IEEE VITAL specification. The SDF file 310, at step 404, is analyzed by the SDF analyzer 204, resulting in an SDF analysis file 312, according to methods to be described later in greater detail. The resulting SDF analysis file 312 is used, at steps 406, 408, to perform an SDF reduction and generate a correlation VHDL file 318, according to methods to be described later in greater detail. The correlation VHDL file 318 is compiled, at step 410, utilizing a VHDL compiler 212.

Figure 20:
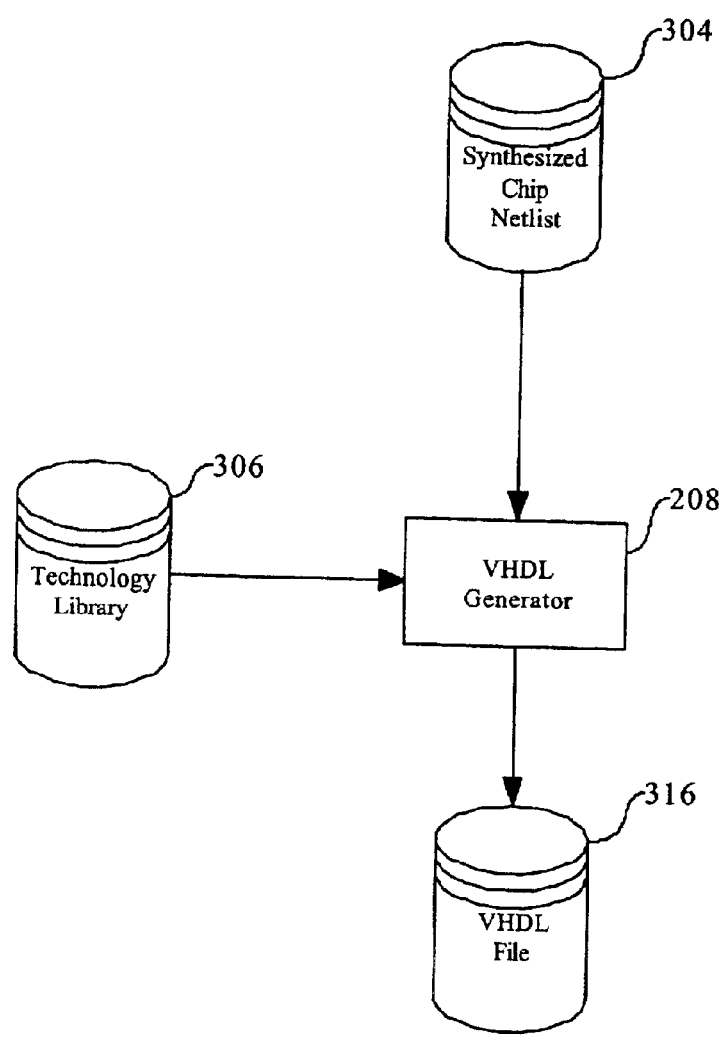
FIG. 20 is a functional block diagram of an exemplary VHDL generation tool in the system of FIG. 1, according to a preferred embodiment of the present invention.

If Path B is chosen, the process proceeds, at step 412, to generate a chip VHDL file 316 and then compile, at step 418. The VHDL generation, at step 412, utilizes a VHDL generation package 208, which takes a synthesized chip netlist 304 and generates technology specific VHDL, as illustrated in FIG. 20. The VHDL generation tool 208 is usually bundled with a synthesis tool. The VHDL compile, at step 418, utilizes an existing VHDL compiler 212, which takes IEEE compliant VHDL as input, and generates VHDL object code suitable to be utilized by an associated VHDL simulator 214.

If Path C is chosen, the technology library 414 is updated one time, at step 414, and compiled, at step 416. The single update, at step 414, is normally all that is required because the target technology library 414 is usually constant at the gate level for a particular chip, or family of chips. The update of the technology library 414 is done in order to provide a mechanism for binding chip specific delay information in a generic fashion, such that a single technology library 414 can still be utilized for multiple chips. The updated VHDL is compiled, at step 416, using a VHDL compiler 212.

Figure 22:
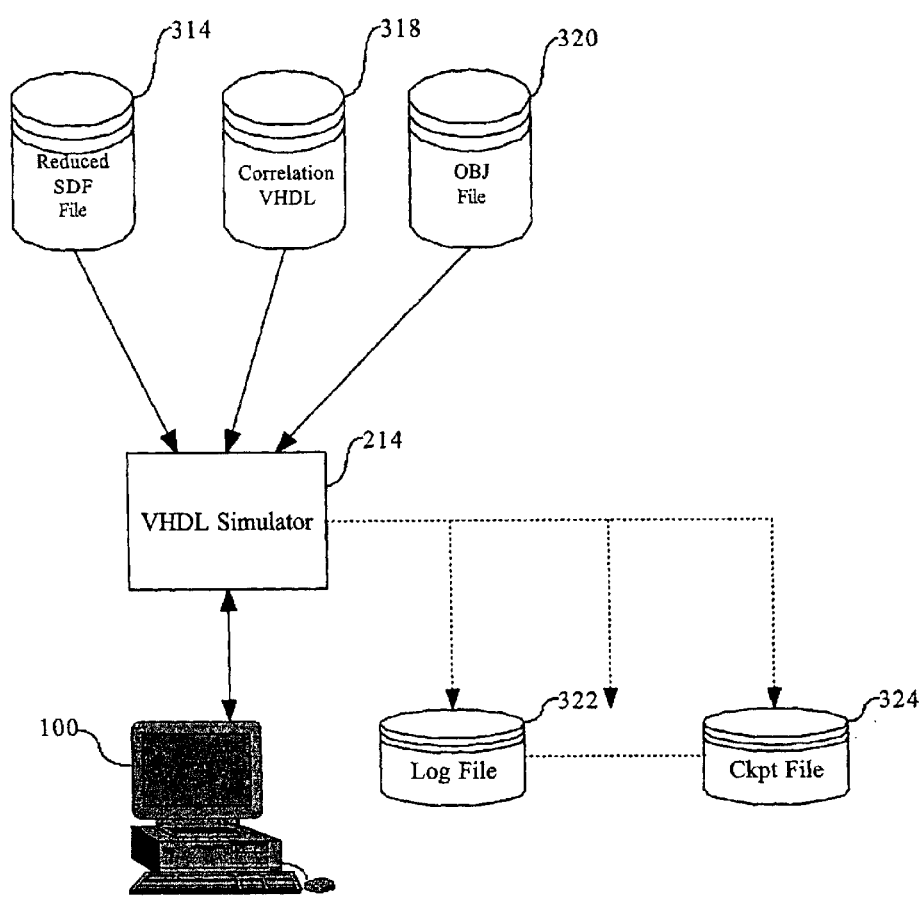
FIG. 22 is a functional block diagram of an exemplary VHDL simulator in the system of FIG. 1, according to a preferred embodiment of the present invention.

At step 420, a VHDL simulation is executed. All paths (A–C) must be complete at this step, such that the SDF and compiled VHDL files are available for simulation as depicted in FIG. 22. Any simulator that supports IEEE compliant VHDL format is suitable for this step.

Figure 5:
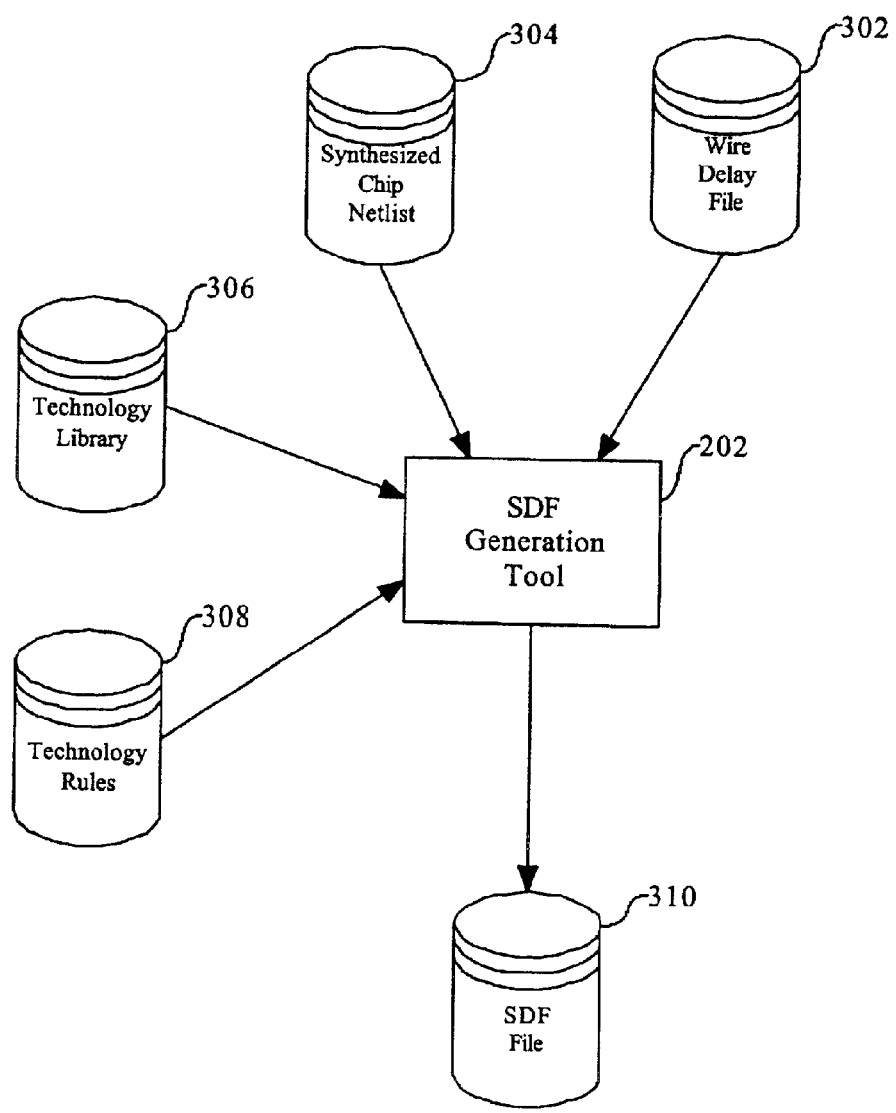
FIG. 5 is a block diagram illustrating the files and tools utilized to generate an exemplary SDF file in the system of FIG. 1, according to a preferred embodiment of the present invention.

FIG. 5 is a block diagram illustrating the files and tools utilized to generate an exemplary SDF file 310 in the system of FIG. 1, according to a preferred embodiment of the present invention. The SDF generation tool 202 may be a custom or vendor provided tool that takes the synthesized chip netlist 304, wire delay information 302, and the technology parameters (the technology library 306 and technology rules 308) as input to generate an SDF file 310.

Figure 6:
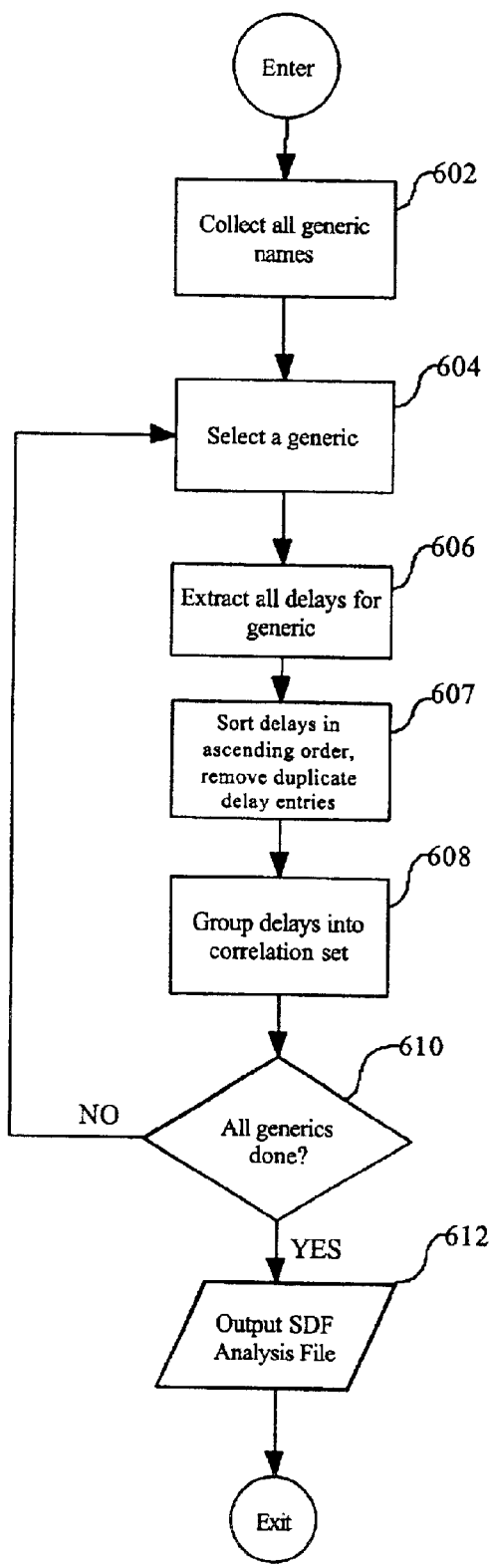
FIG. 6 is an operational flow diagram illustrating an exemplary operational sequence for analyzing an SDF file by the system of FIG. 1, according to a preferred embodiment of the present invention.

FIG. 6 is an operational flow diagram illustrating an exemplary operational sequence for analyzing an SDF file 310 by the system of FIG. 1, according to a preferred embodiment of the present invention. The intent of this sequence is to take as input an existing SDF file 310 generated as shown in FIG. 5. The SDF file 310 is utilized to perform delay correlation analysis. Once the correlation process completes, the correlation results are placed in an SDF analysis file 612, which can be utilized by multiple downstream processes to exploit the correlation savings.

The correlation process produces a reduced set of delays, by performing delay correlation analysis across an entire chip as represented in the SDF file 310. The correlation process shown correlates delays according to a policy of combining common delays for a common delay generic name. It will be obvious to those of ordinary skill in the art, in view of the present discussion, that alternative embodiments of the invention are not limited to this correlation policy (a set of criteria used to combine delays). Other policies could be utilized to take advantage of common delay properties for a chip, for example, that can be exploited if delay specifications are not bounded by the scope of a single logic gate instance, as discussed in the examples provided herein.

Figure 7:
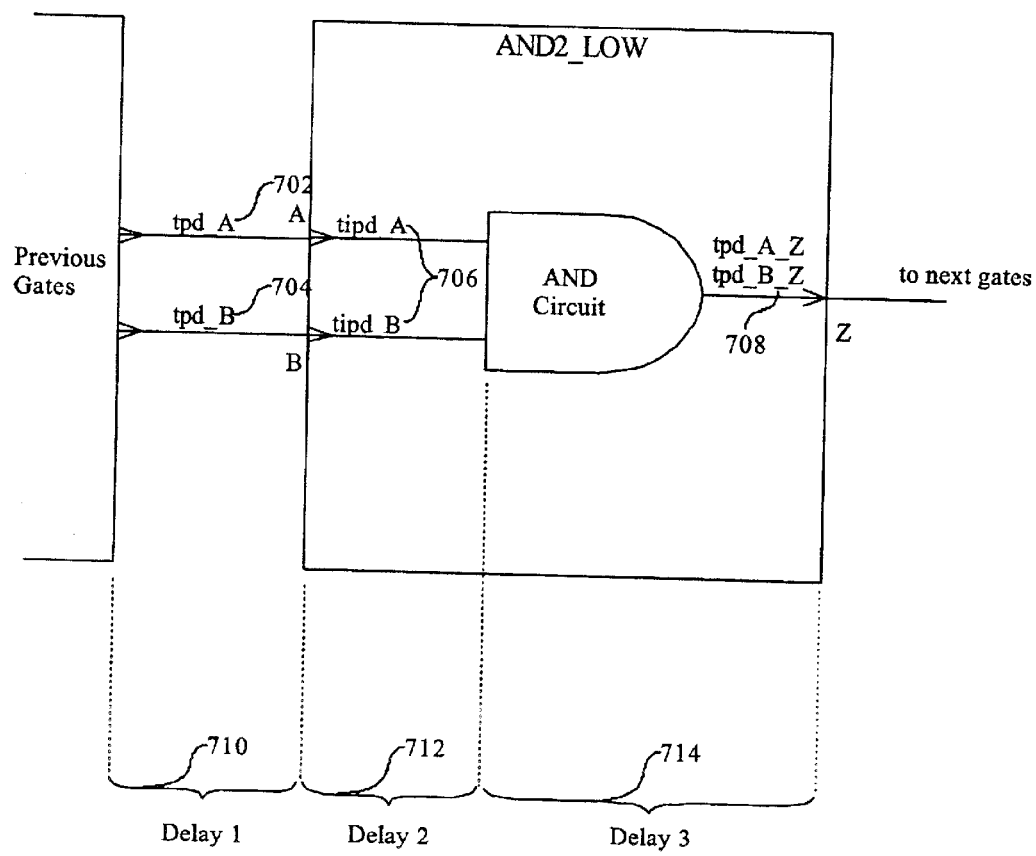
FIG. 7 is a circuit-timing diagram illustrating delays associated with a VHDL AND2_LOW gate in a VHDL model.

The SDF analyzer 204 enters the sequence, at step 602, where it collects all the unique generic variable names specified in an SDF file 310. For example, tpd_A 702 (see FIG. 7) is a generic name (delay name) for the propagation delay from a previous gate to pin A of a logic gate. The SDF file 310 contains values for all the delays for every gate in the synthesized chip netlist 304. So, for example, for the gate shown in FIG. 7, the delay1 710 is the delay from the driving gate to this pin (e.g. tpd_B 704); delay2 712 is the internal delay from the gate I/O pad to the internal AND circuit (e.g. tipd_A); and delay3 714 is the delay to the output pin Z due to a change in pin A or pin B input pins (e.g. tpd_A_Z and tpd_B_Z 708). Each usage of this particular AND2_LOW gate 700 would have a unique set of delays associated with it (rise and fall times).

A particular generic, such as tpd_A, is selected, at step 604. Then, at step 606, all the delays assigned to this generic for the entire chip are extracted from the values in the SDF file 310. A list of logic gate instances that reference this generic is maintained in data memory and placed in the SDF analysis file 612 on completion. For example, both gate1: AND2_LOW and gate2: AND2_LOW are instances of the AND2_LOW usage such that separate indexes would be needed for the tpd_A generic. The delays are preferably sorted in ascending order, at step 607, and any duplicate delay entries are removed. At step 608, the sorted delays are grouped into sets of up to 62 entries corresponding to correlation sets (this is explained later in greater detail). At step 610, the SDF analyzer 204 determines if all the generics of the SDF file 310 have been analyzed. The process, beginning at step 604, is repeated for each generic of the SDF file 310. At step 612, an SDF analysis file 312 is generated. The SDF analysis file 312 contains delay data for the entire chip, which has been correlated according to a particular correlation policy. This file encapsulates the inherent delay redundancies across the entire chip for a particular policy. An example of a correlation policy would be the correlation of delays with same generic name. The SDF analysis file 312 is utilized, at step 406, to generate a reduced size SDF file 314 (no explicit delays specified), and to bind the technology library 306 to the set correlated delays, at step 408. A system implementation could also use this file to generate statistics for a particular correlation policy, such that a plurality of unique correlation policy results could be compared for highest efficiency.

Figure 8:
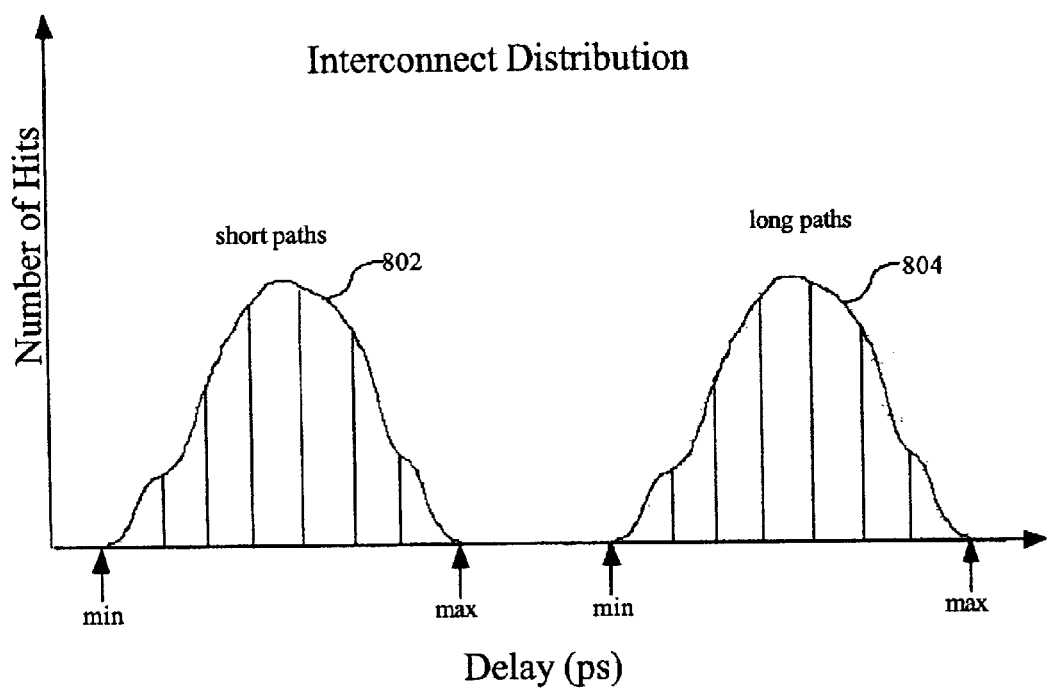
FIG. 8 is a graph displaying the distribution of delay values for interconnection paths in a typical VHDL file.
Figure 9:
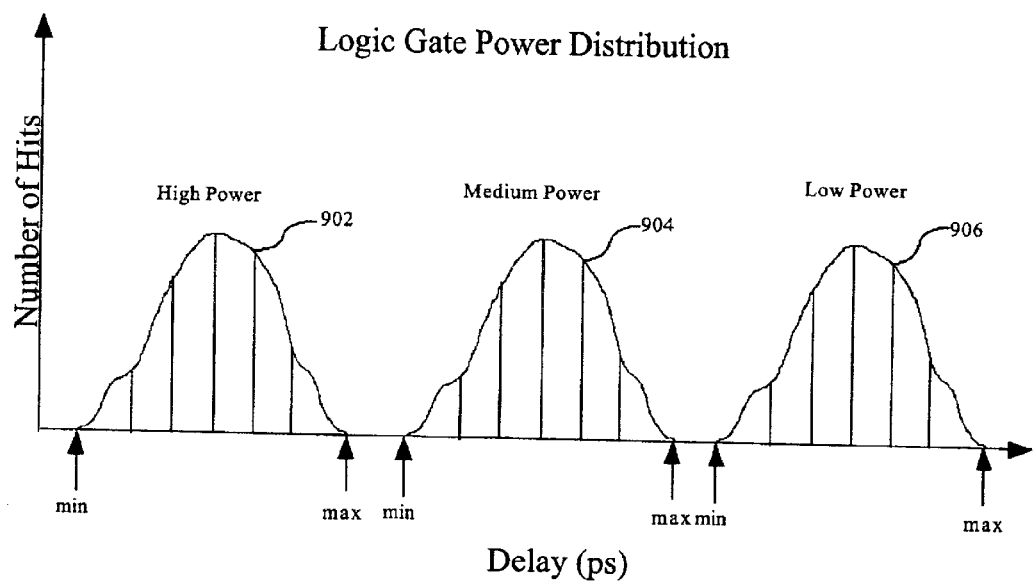
FIG. 9 is a graph displaying the distribution of delay values for different logic gate power levels of a typical VHDL file.

In practice, careful observation has shown that delays are not strictly uniformly distributed. Synchronous logic has a bounded cycle time requirement, where the latch-to-latch propagation delay, through combinatorial logic, must be less than the chip cycle time. Therefore, delays are usually clustered about a range of values, with an upper bound delay equal to the cycle time. In order to allow for transversal of multiple combinatorial logic gates between latches, the majority of the delays are clustered around an even smaller range of values, relative to the cycle time. As shown in FIG. 8, interconnect delays will cluster around certain points dependant upon path lengths. Short delays 802 are for short path lengths and longer delays 804 are for long path lengths. Although not indicated in the figure for purposes of clarity, there is a possibility of overlap of the sets of values. For intra-circuit delays, values will cluster around the drive capabilities (such as speed, power). FIG. 9 indicates the distribution of logic gate delays according to power levels (high 902, medium 904, and low power 906). Again, though not shown in this example, there exists the possibility of overlap.

Assuming the binding of rise/fall tuples to VHDL generics is broken, coupled with the observation that delay values tend to cluster, there could be a very narrow range of delay values. For example, in the VHDL generic:

$tpd\_A$=(rise time, fall time), if the rise time were a separate object from fall time, now the worst-case probability for a delay match, in the range 0 ns to 0.999 ns in 1 ps intervals, would be 1 in one thousand. If clustering occurs due to the technology, the probability of a match could be in the range of 1 in one hundred. This decoupling of tuples provides a mechanism for recognizing redundancies across logic gates, which opens up the set of delays that can exploit this technique.

Figure 10:
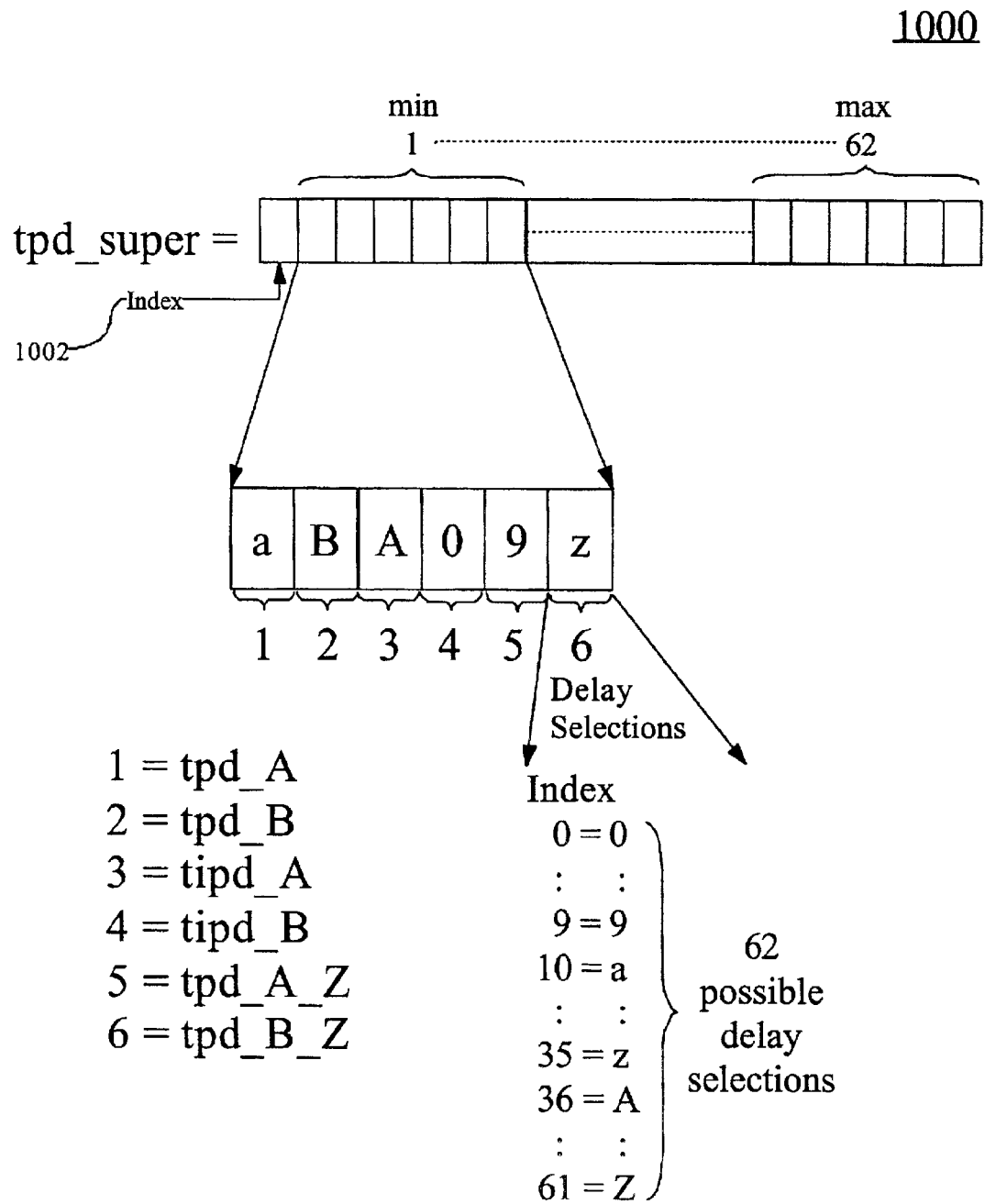
FIG. 10 is a data block diagram illustrating a unique, 1×, SDF super generic data structure of the system of FIG. 1, according to a preferred embodiment of the present invention.

FIG. 10 illustrates a unique data structure 1000 that captures the net effect of the delay correlations without having to specify the same amount of data as in a traditional SDF file 310, but still maintains SDF compatibility to the VITAL specification. This data structure 1000 will be referred to as a 1× data structure hereafter, for reasons that will soon become apparent. A great advantage of this 1× data structure is that existing software can readily utilize this technique. The 1× data structure tpd_super 1000 represents a "super generic" value in a reduced SDF file 314 that encapsulates all of the delay values for a particular gate. There will be, at most, only two generic specifications in the reduced SDF file 314, one rise time generic variable for rise time values and one fall time generic variable for fall time values. Generic values that are one dimensional, such as clock pulse width, may be specified in either or both the rise time and fall time generics. The first position 1002 of the 1× data structure contains an index value for the correlation set. The value of the index is represented by one of 62 characters: the numerals 0 to 9, the lower case alphabet a to z, and the upper case alphabet A to Z. The remaining positions of the 1× data structure represent actual delay values in the correlation set for specific delays in the generic.

For example, as shown in FIG. 10, the 1× data structure representing the rise times for an AND2_LOW gate is a string of 7 digits; the "0" position representing the index position in a correlation set, the "1" position representing the tpd_A delay value position, the "2" position representing the tpd_B delay value position, the "3" position representing the tipd_A position, etc.

It is worthwhile to note that the set of valid characters allowed by VHDL are those defined by the ISO 8859-1 standard, which defines 256 ($2^8$) characters. Therefore, the maximum number of delays that could be allowed is 256. However, aside from the 62 alphanumeric characters, the other characters are either messy ($%*@) or unprintable. So, the number 62 was chosen for illustrative purposes, whereas, the maximum number of delays in this example could actually be up to 256.

Figure 11:
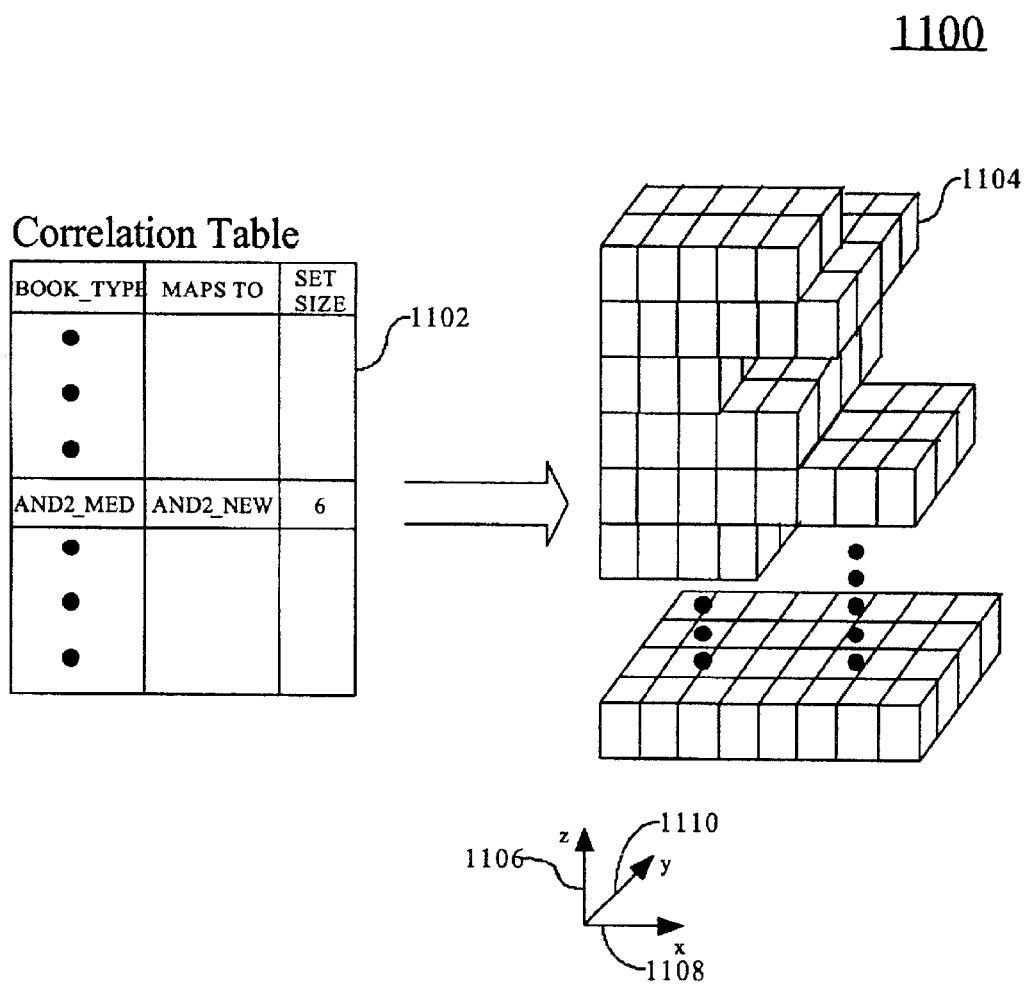
FIG. 11 is a data block diagram illustrating mapping correlation delays to a VHDL file of the system of FIG. 1, according to a preferred embodiment of the present invention.

A separate exemplary data structure 1104, shown in FIG. 11, and that will be utilized in the correlation VHDL 408, contains the constants (actual delay values) that equal the delays for all of the gates. This data structure 1104 comprises an array (may be also referred to as a matrix) of delay values preferably organized for efficiently indexing and retrieving the values from the data structure 1104. This structure 1104 is also used to bind the correlated delay values to the VHDL technology library 306 via a VHDL package (a VHDL construct that allows for sharing of common data items). A 3-dimensional variable array structure is utilized to most efficiently specify correlated delays. The z-axis 1106 of the data structure represents a set of common blocks for each logical topology (e.g AND2_LOW (low power), AND2_MED (medium power), AND2_HIGH (high power) are one set of common blocks: AND2_NEW). Each entry on this axis depicts logic gates with a common topology (same amount and type of delays). On the x-axis 1108 each position represents a delay value for the gate topology (e.g. slot 1=tpd_A for AND2_NEW). The y-axis 1110 contains the actual delays.

The 3D variable array structure 1104 is used for efficient representation of correlation delays for a particular correlation set. The X-axis and Y-axis depths are not necessarily equal to each other, nor are they necessarily equal to the X or Y-axis depths for another Z entry. Expressing the variable dimensions of the 3D array structure 1104 as a set of 3-tuples, where each variable dimension would be an element {Z, X, Y} in the set where:

Z=Logic topology type selector

X=Maximum Generic Selection Slot

Y=Maximum Number of Correlation Entries a typical tuple $X_1Y_1Z_1$ for a two input AND gate would be {5,6,40}, where 5 is the entry for a two input AND gate topology, and 6 is the number of generics, and 40 would indicate a maximum of 40 unique delay values in the correlation set. The $X_1$ value of 6 is defined by the gate topology, the $Z_1$ and $Y_1$ values would vary, based on the processing order ($Z_1$) and delay correlation ($Y_1$). A larger gate (e.g. Latch) topology would have a different delay correlation capacity identified by $Z_2X_2Y_2$ tuple {2,20,60} (Logic gate topology 2, Total of 20 generics defined, Total of 60 unique delay values utilized in this correlation set). The following calculations demonstrate the efficiencies of using this variable structure approach versus a uniform dimension array for just two entries:

Given: 4 bytes per slot entry
  Entry 1: dimension 3-tuple={5,6,40}
  Entry 2: dimension 3-tuple={2,20,60}
  $X_{max}$=max($X_1$,$X_2$)=max(6,20)=20
  $Y_{max}$=max($Y_1$,$Y_2$)=max(40,60)=60

Calculations:
  Uniformed Array Size Requirement (2 entries)

2 entries*($X_{max}$*$Y_{max}$)slots/entry*4 bytes/slot=(2)*(20*60)*4=9,600 bytes Variable Array Structure Size Requirements (2 entries):
  Entry 1:

($X_1$*$Y_1$)slots*4/bytes/slot=(6)*(40)*4=960 bytes

Entry 2:

($X_2$*$Y_2$)slots*4 bytes/slot=(20)*(60)*4=4800 bytes

Total Variable Array Size=4800+960=5760 bytes.

Savings using variable array (two entries)=9600−5760= 3,840 bytes As the number of 3D entries for a chip will normally run in the hundreds, the savings realized can be extrapolated.

As an example, suppose the correlation profile of AND2_LOW, AND2_MED, and AND2_HIGH are disjoint and resemble the distributions shown in FIG. 9. To represent the delays for all three types of AND2_xxx gates in a single generic would look like:
  AND2_LOW:
    tpd_super_rise="0aQ3478"
    tpd_super_fall="0tu8AcT"
  AND2_MED:
    tpd_super_rise="1y76Q25"
    tpd_super_fall="14Xampl"
  AND2_HIGH:
    tpd_super_rise="2tuvwxy"
    tpd_super_fall="2abcdef"

The decoding of the super generic of AND2_MED where tpd_super_fall="14Xampl", is illustrated in FIG. 12. The character value of position 0 shows that the position of the correlation set for the delays of AND2_MED is 1. The delay value for position 1, tpd_A="4", is located at the $5^{th}$ position in the correlation set.

Figure 13:
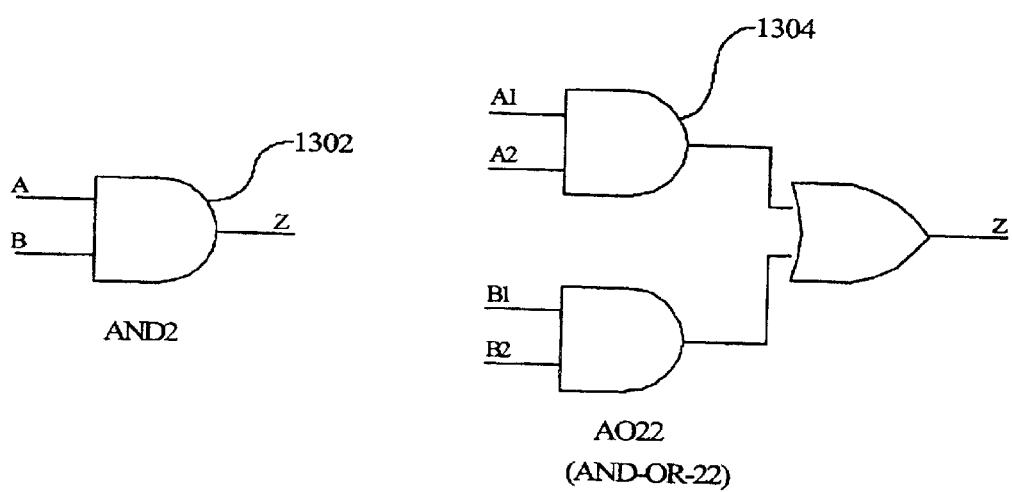
FIG. 13 is a logic circuit diagram illustrating the correlation of arbitrary logic blocks for the system of FIG. 1, according to a preferred embodiment of the present invention.

This procedure can be taken a step further in order to correlate arbitrary logic blocks, such as those shown in FIG. 13, using the Z entry (which is the logic gate topology index). Gates with similar topology (AND2, OR2... ) would have a common Z entry. One can correlate across different topologies when the Z entry becomes "the generic entry" (e.g. tpd_A). Now any logic gate that uses tpd_A knows to utilize that entry. VHDL allows for associative array indexes (or pointers), such that the technology library 306 would literally use an index (or pointer) of "tpd_A", which would map to the proper Z entry. This allows for correlations across a wide range of logic gates, realizing significant savings. The gate structure AO22 1304 is actually a combination of two AND2 gates 1302 (previously discussed) and an OR2 gate. This correlation has a much larger set of delays with a higher probability for correlating the data.

Figure 14:
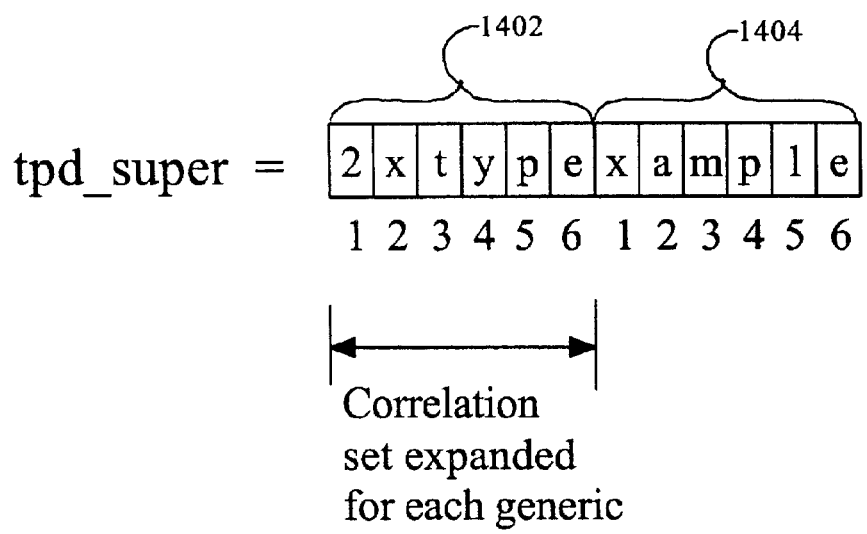
FIG. 14 is a data block diagram illustrating a unique, 2×, SDF super generic data structure of the system of FIG. 1, according to a preferred embodiment of the present invention.

In order to optimize delays across functional gates usually requires more capacity than the 1× data structure 1000 can provide. This method likely requires a 2× data structure 1400 (shown in FIG. 14), where the first set 1402, preferably, indexes to 1 of 62 possible slots and the second structure 1404, preferably, indexes to 1 of 62 possible delay values in that slot. The 2× data structure 1400 is so named because it is approximately twice the size of the original 1× data structure 1000 (e.g. for the AND2 gate, there are 12 characters vs. 7 characters).

Figure 15:
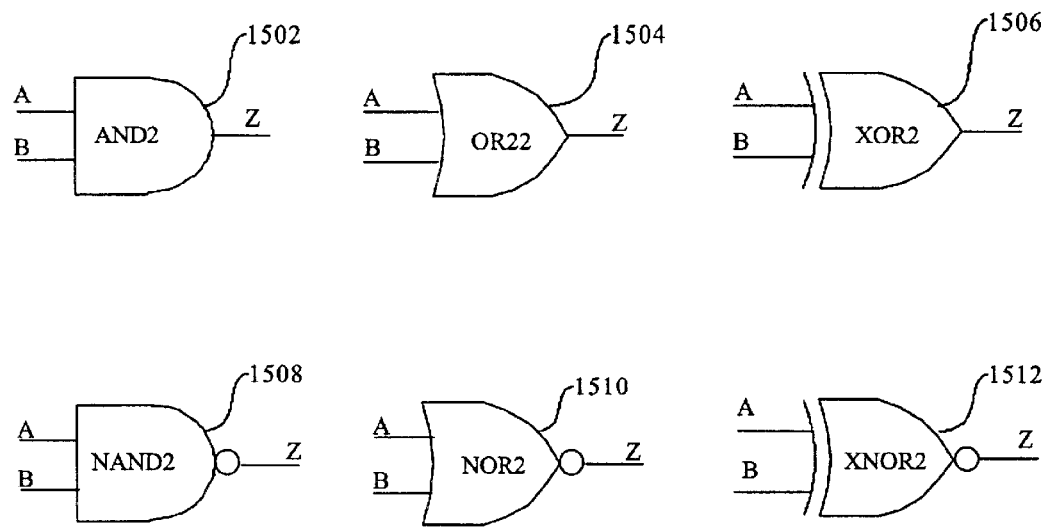
FIG. 15 is a logic circuit diagram showing exemplary VHDL logic structures with identical delay topologies.

A correlation can be performed on a pin type such as tpd_A. Then, any delays to gates that have a tpd_A pin will be correlated as a group. Now, delays from gates with different functional operations, such as those shown in FIG. 15 can be merged. All of the gates in FIG. 15, and possibly others, would have a commonly named tpd_A and tpd_B pin.

When correlations are performed within a gate topology, the actual VHDL model that would incorporate the delay values knows ahead of time that AND2, OR2, etc. have a 6-entry 2× format and can pick off the right values in the data structure. If the correlation were performed across gate topologies, the actual VHDL model would still know which generic entries to select. Therefore there are minimal VHDL updates to the existing VHDL. A one time conversion of the technology library 306 assures that the AND2_xxx VHDL models, for instance, point to a fixed location where tpd_A data would reside.

Figure 16:
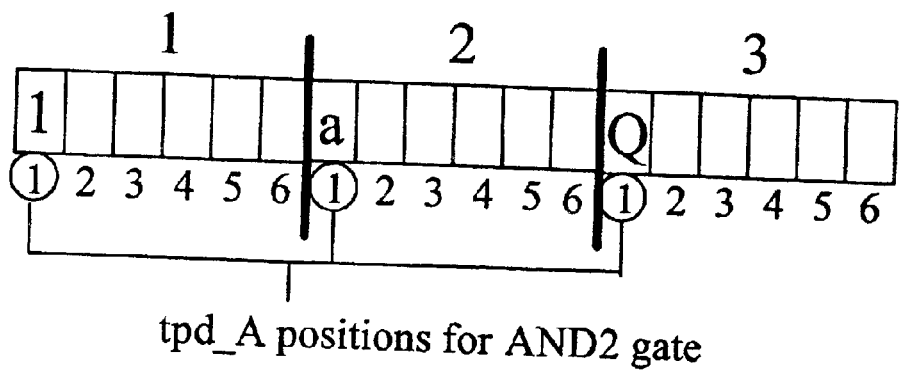
FIG. 16 is a 3× format illustration and decode table illustrating exemplary set of rise times with both positive and negative delays of the system of FIG. 1, according to a preferred embodiment of the present invention.

Taken one step further, a 3× data structure 1600 (shown in FIG. 16) can represent 238,328 ($62^3$) possible delays. This allows all the delays to be uniquely specified, without any correlation, using only data structure conversions and decodes. The tradeoff is that there are more characters in the reduced SDF file 314, but there would still be a significant SDF reduction that results in size and time savings. The 3× data structure 1600 typically pays a flat storage penalty up front. It is typically larger by 50% over 2× structure per gate. It is still a very efficient representation versus a conventional SDF, yet it can accommodate the range of gate delays for most chips. The 1× and 2× structures pay a smaller price, but also supply a correlation array structure. If the delay correlations are good, the 1× or 2× structures will be more efficient overall (total simulation model size).

Figure 17:
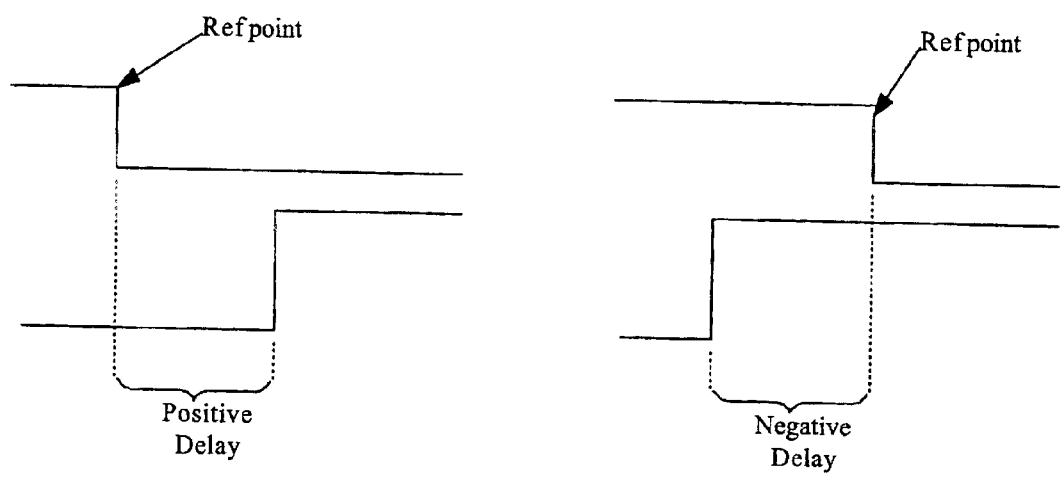
FIG. 17 is a signal-timing diagram illustrating the concept of negative delays for the system of FIG. 1, according to a preferred embodiment of the present invention.

The 3× data structure 1600 handles both positive and negative delays, as shown in FIG. 17. So, there will be an efficient representation of negative delays also. A key observation of this 3× data structure 1600 is that the range of negative delays is usually much smaller than positive delays because negative delays involve an "overlap" case that is valid for a short period of time relative to a reference point. The asymmetry in the range of positive vs. negative delays can be utilized in order to keep the structure indexes minimal by not requiring a sign for each delay. A negative "base delay", such as −0.500 ns, is assigned to the 0 position, and the value of each position is increased by 1 ps per position for 238,327 increments. So, the entire range of −0.500 ns to +237.327 ns can be realized by a single 3× data structure 1600, where the delay is basically a base 62 number plus a signed offset base number.

In actuality, this method allows for a 3× range of $(2^8)^3=2^{24}$ or 16 million increments, which amounts to a 16 microsecond range at 1 picosecond intervals. This is more than enough of a range of delays to accommodate any chip. However, the 3× structure is a scalable format, where 4×, 5× . . . n× structures could be easily constructed and utilized with potential size savings. Anything beyond a 3× structure should not be needed for most chips.

The VHDL model would have fixed equations such as:

$$Delay=Base+(tpd\_A\_1*62^2)+(tpd\_A\_2*62^1)+(tpd\_A\_3)$$

where, tpd_A_1, tpd_A_2, and tpd_A_3 are the decoded character values (0–61) of the first position in each of the three sets of the 3× data structure 1600. The 3× data structure 1600 in FIG. 16 indicates values of tpd_A_1=1 (1), tpd_A_2=10 (a), and tpd_A_3=52 (Q). So, in this case:

$$Delay=-500\ ps+(1*62^2)+(10*62)+52$$

$$Delay=-500+3844+620+52\ ps=4016\ ps=4.016\ ns$$

Note that the equation is evaluated in ps in order to work with whole numbers.

Usually the delays associated with timed synchronous logic are bunched around a particular cycle time. However, for severely disjoint ranges, the 2× structure should be used in order to decrease the overall range of delay values. Also, the SDF analysis file 312 allows for certain portions of the SDF to remain untouched, for robustness.

Figure 18:
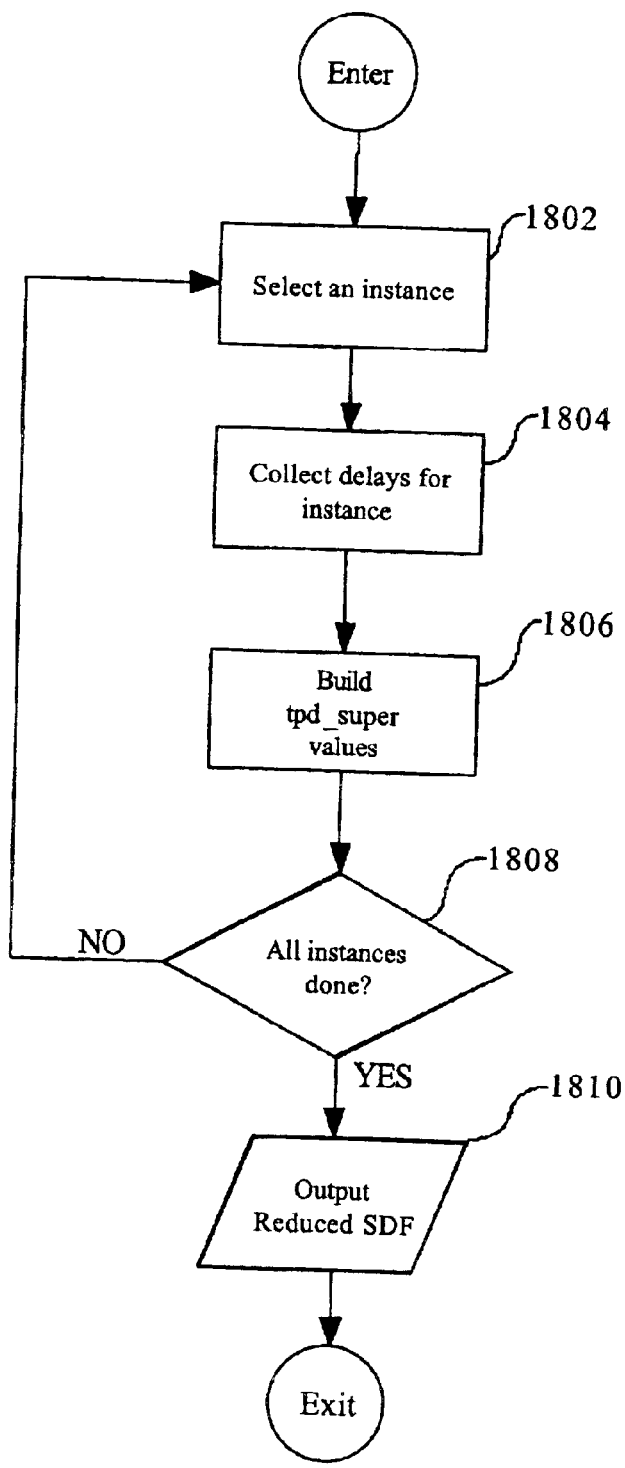
FIG. 18 is an operational flow diagram illustrating an exemplary operational sequence for combining a set of delay data, for a particular logic gate instance, into a single delay generic for the system of FIG. 1, according to a preferred embodiment of the present invention.

After an SDF analysis file 312 has been created, the SDF reducer 206, as shown in the operational flow diagram of FIG. 18, uses it to create a reduced SDF file 314 that is much smaller in size. The reduced SDF file 314 is still a VITAL compliant SDF with a significantly reduced number of generics (two generics per logic gate instance). The SDF file 310 is built on a per instance basis and each instance contains tuples of the rise and fall times of each delay in the structure. The SDF reducer 206 enters the process, at step 1802, and selects an instance of a gate (e.g. gate1: AND2; gate2: AND2 are two instances of the AND2 gate with separate delay values) from the SDF file 310. At step 1804, all the delay values for the selected instance are collected from the SDF analysis file 312. Then, at step 1806, the SDF reducer 206 builds the two single super generics tpd_super_rise (rise times) and tpd_super_fall (fall times) for the selected instance. It is understood that each super generic will be represented by a collection of pointers into a data structure array (or matrix) containing all the relevant delay values. For each instance, in the SDF file 314, the collection of pointers, that point into the data structure array (or matrix) for the super generic to be able to resolve the actual delay values for the particular instance, takes up significantly much less storage than a set of conventional generics (storing information to conventionally identify actual delay values) for a similar instance. Advantageously, the size of the pointers for each instance, according to the preferred embodiment of the present invention, will typically be significantly smaller (more efficient) in overall storage requirements than the storage requirements of the information stored for delay values associated with instances in a conventional implementation SDF file. This novel process is repeated for every instance of every gate. Therefore, the storage efficiencies are multiplied by the number of instances in an overall SDF file. If all the instances, at step 1808, have been converted, then a significantly reduced SDF file 314 is output, at step 1810. Besides the increased storage efficiency by removing duplicate delay values and storing these in an organized fashion in the super generics, the use of the memory efficient pointers in an SDF file will additionally reduce the amount of memory storage used for an implementation. This is an important advantage of the present invention over any known prior art systems.

Figure 19:
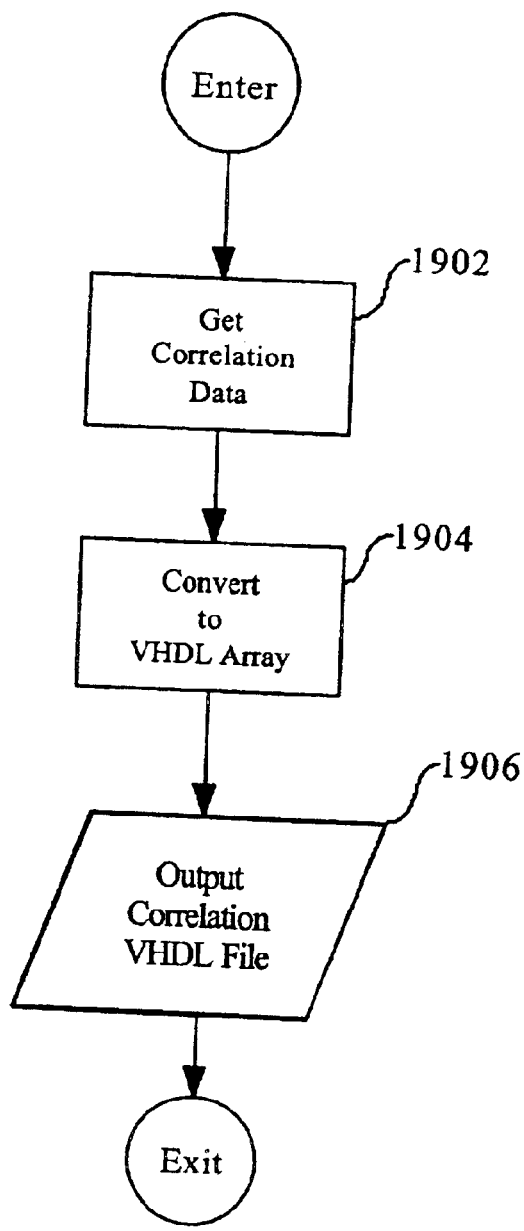
FIG. 19 is an operational flow diagram illustrating an exemplary operational sequence for encapsulating a set of delay data for the chip into an array data structure for the system of FIG. 1, according to a preferred embodiment of the present invention.

The process of generating the correlation VHDL file 318, according to step 408, is shown in FIG. 19. The VHDL correlation generator 210 enters the process at step 1902 where the correlation delays are extracted from the SDF analysis file 312. The VHDL correlation generator 210, at step 1904, generates a VHDL associative array structure (or matrix structure) such that, for example, character "a" is used as an array index (or index into the matrix). Then, the correlation VHDL file 318, which is a unique VHDL package file with correlation data embedded, is output, at step 1906.

The overall process of generating a VHDL file 316, according to step 412, is shown in FIG. 20. The VHDL generator 208 uses the synthesized chip netlist 304 and the technology library 306 to create a chip VHDL file 316. The chip VHDL file 316 is the representation of the chip in the VHDL language.

The technology library 306, which is VHDL code describing the behavior of the logic gates, is only updated once, at step 414, and is independent of the actual delays. It can be done prior to building a simulation model for a chip. This allows binding the delays in the VHDL gate description to a specific chip delay profile without requiring unique copies of the Technology Library 306. This one time update of the Technology Library VHDL 306, is based on pre-determined gate topologies. The generic value positions in the structure are known ahead of time, and the actual entries are from the tpd_super_xxx generics for the gate.

Current state of the art provides a mechanism to back annotate delays using a VITAL compliant SDF file. The concept of correlating decoupled rise and fall delays, and exploiting this correlation with reduced SDF structures, provides the potential for a much smaller and more efficient event simulation model with delays. To exploit these potential savings, the correlated delay values (1x or 2x formats) must still be communicated to the Technology Library VHDL models 306, which now only have two generics specified. A unique mechanism provides an efficient VHDL compliant mechanism to automatically customize a Technology Library 306 at simulation time with actual delay values, using a condensed set of correlated delays, by providing a unique interface to access correlated delays, that eliminates explicit back annotation of delay values. This discussion discloses a preferred embodiment of an interface to exploit the 1x and 2x structures respectively.

Given the 3D correlation structure, the Z-axis entries for 1x structures are typically logic gates with similar topologies that have correlated sets of delays. The set of Z-axis entries could be thought of as a set of arrays $Z_1, Z_2 \ldots Z_n$ where each array is two dimensional, such that array entry $Z_n$ be viewed as an array $Z_n(X_n, Y_n)$, where $Z_n$ is the nth entry in data structure representing a set of delays associated with a common correlation policy. The dimension $X_n$ represents sets of delay generics, and dimension $Y_n$ are the correlated delay values. For 1x structures, a delay correlation policy would typically be across gates with a common topology. For 2x structures, a typical correlation policy would be delays associated with a common generic name.

The set of arrays $Z_1$–$Z_n$ would be defined as a set of VHDL compliant array constants (output of 408), which are compiled into a VHDL package body (output of 410). VHDL semantics allow independent compilation of VHDL constant declarations and actual values, such that binding can be deferred until simulation time. This is also known as late binding at run time. Utilizing this capability, a unique mechanism can be derived that automatically maps the delays encapsulated by the 1x and 2x data structure to a Technology Library VHDL model 306 with no explicit delay back annotation.

The VHDL Technology Library modifier 216 updates the Technology Library 306 by inserting the tpd_super_rise and tpd_super_fall generic declarations for every VHDL gate model in the Technology Library 306. For every other generic in each VHDL gate model, the initialized value (usually set to zero in model: tpd_a:VitalDelayType01:= (0.000 ns, 0.000 ns); ) is changed to an equation associated with the correlation policy.

The following shows an example of equations for referencing correlation delays for a 1x type data structure:

Given: Type 1x delay correlation on AND2_H gate VHDL

Tpd_super_rise: STRING:="1QABCDE"; (Back Annotated)

Tpd_super_fall: STRING:="1ABCDEF"; (Back Annotated)

Tpd_a : VitalDelayType01
:=(AND2_H_RISE(((tpd_super_rise(0)*6)+tpd_a_offset),
tpd_super_rise(1)),
AND2_H_FALL(((tpd_super_fall(0)*6)+tpd_a_offset),
tpd_super_fall(1)));

In this example, the AND2_H_RISE 2D array constant would be the name for all 2-input gate topologies to satisfy a multiple gate correlation policy. Bit 0 of tpd_super_rise is used to jump to a set of generics for a particular accessed for rise time delay resolution. A name could be aliased to a common correlation set in the 1x structure (for a 2-input topology, there are 6 generics defined). The delays for the tpd_a generic are predefined to be the 1st definition in an AND2_H correlation set, so the technology library 306 knows to use this value to select the proper set of delays. It is also known that tpd_super_rise/fall are defined to have the generics ordered the same, so bit 1 (after correlation set selector) is the tpd_a delay index to the actual delay value. The value of tpd_super_rise(1) is character "Q" which would map to the 52nd delay entry of the correlation set for tpd_a. A similar, but independent, indexing scheme is performed to get the fall time delay value.

The following shows the equation for referencing correlation delays for a 2x type data structure, using a different correlation policy:

Given: Type 2x delay correlation on common generic "tpd_b"

Tpd_super_rise: STRING:="ABCDEFQABCDE"; (Back Annotated)

Tpd_super_fall: STRING:="GHIJKLABCDEF"; (Back Annotated)

Tpd_b: VitalDelayType01
:=(AND2_H_RISE((tpd_super_rise(1)*tpd_b_offset),
tpd_super_rise(7))
AND2_H_FALL((tpd_super_fall(1)*tpd_b_offset),
tpd_super_fall(7)));

In this example the equation looks similar, but there are subtle changes that indicate the power of this mechanism using a 2x structure. The VHDL is still updated using 2D array AND2_H_RISE, but the name is now aliased to point to a common correlation structure that is based on generic names. The main difference is that the term tpd_a_offset would have a much larger value than 0 (it could be defined as the 22nd entry in the correlation set of all generics for the chip). The same 2x tpd_super_rise and tpd_super_fall values are used to designate a 2x structure of 6 independent correlation sets for 6 independent generics defined for a two input AND gate. While still using local gate level semantics for delay specification, one can take advantage of global chip level correlation optimizations.

In both examples, the two final rise and fall time values would be used to define the rise and fall times for the VHDL constant tpd_a, which would be referenced by the VHDL model when delay values for tpd_a are required. Since tpd_a is now a constant as opposed to a generic, no back annotation of delay values is required, because these equations consist entirely of references to constants, indexed using two generics. The resolution of the actual constant values is performed once at the beginning of simulation.

Figure 21:
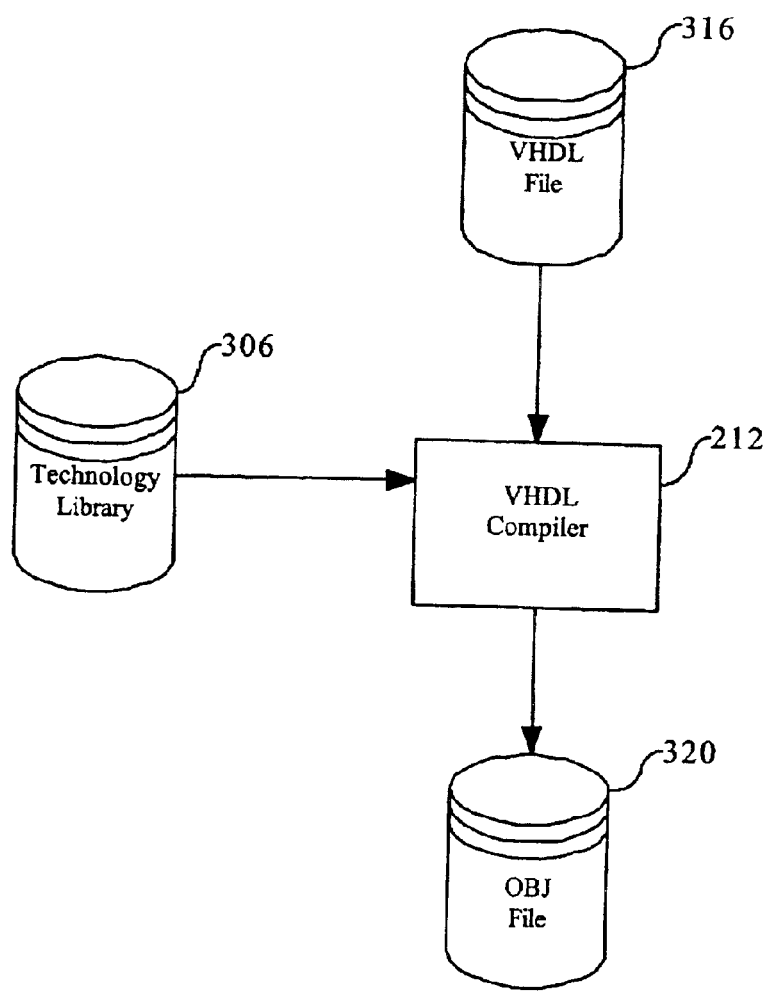
FIG. 21 is a functional block diagram of an exemplary VHDL compiler in the system of FIG. 1, according to a preferred embodiment of the present invention.

FIG. 21 illustrates the process of compiling a chip VHDL file 316, according to step 418. The VHDL compiler 212 uses the chip VHDL file 316 and the technology library 306 to generate an object file 320. The object file 320 contains the machine language executables used to simulate the chip on a particular workstation platform. The correlation VHDL file 318, the technology library VHDL 306, and the actual chip VHDL 316 can be compiled at separate times.

FIG. 22 illustrates performing an actual VHDL simulation. The VHDL modeling system 100 executes a VHDL simulation 420 using the reduced SDF file 314 and the object file 320 of the chip. The fact that the reduced SDF file 314 is much smaller than the original SDF file 310 increases the performance of the VHDL simulator 214 by decreasing both the run time of the simulation and the amount of memory required to contain the information. The technology library 306 binds the compiled correlation VHDL module 318 to itself at simulation time. The technology library 306 will reference the correlation array (or matrix), defined in the compiled correlation VHDL file 318, as a VHDL package, which is an external library file in VHDL parlance, a recursive use of VHDL library function. All required files are bound together as part of the simulation load process (all external references are resolved by the binding process, sometimes referred to as the elaboration phase of loading the simulation model). So, the chip VHDL 316 is un-altered from what would occur in a normal run. All of the delay correlations, the SDF reductions, and Technology Library updates are bound to the chip VHDL 316 at simulation time.

During the simulation, the super generics are back annotated as in prior art. The equations in the updated technology library 308 now use the super generics to index into the new array structures defined in package VHDL, at step 408, to extract the actual delay values. No back annotation is required to do this—just the pointer resolution when VHDL modules are linked together in the elaboration phase of VHDL simulation (the elaboration phase is known to people versed in art of VHDL simulation models). The elimination of the back annotation step saves a considerable amount of time.

The simulation may be initiated by a user, or could alternatively be run in a batch mode process such that no human intervention is required. The simulation may also output certain other files, such as a log file 322 or checkpoint file 324, for use by other downstream tools.

The present invention can be realized in hardware, software, or a combination of hardware and software. A system according to a preferred embodiment of the present invention can be realized in a centralized fashion in one computer system, or in a distributed fashion where different elements are spread across several interconnected computer systems. Any kind of computer system—or other apparatus adapted for carrying out the methods described herein—is suited. A typical combination of hardware and software could be a general-purpose computer system with a computer program that, when being loaded and executed, controls the computer system such that it carries out the methods described herein.

The present invention can also be embedded in a computer program product, which comprises all the features enabling the implementation of the methods described herein, and which—when loaded in a computer system—is able to carry out these methods. Computer program means or computer program in the present context mean any expression, in any language, code or notation, of a set of instructions intended to cause a system having an information processing capability to perform a particular function either directly or after either or both of the following a) conversion to another language, code or, notation; and b) reproduction in a different material form.

A computer system may include, inter alia, one or more computers and at least a computer readable medium, allowing a computer system, to read data, instructions, messages or message packets, and other computer readable information from the computer readable medium. The computer readable medium may include non-volatile memory, such as ROM, Flash memory, Disk drive memory, CD-ROM, and other permanent storage. Additionally, a computer readable medium may include, for example, volatile storage such as RAM, buffers, cache memory, and network circuits. Furthermore, the computer readable medium may comprise computer readable information in a transitory state medium such as a network link and/or a network interface, including a wired network or a wireless network, that allow a computer system to read such computer readable information.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method for delay correlation analysis for VHDL modeling, comprising:

copying a rise time delay value and a fall time delay value from a tuple of a VHDL generic variable;

storing a rise time generic variable and a fall time generic variable, the rise time generic variable comprising at least one rise time delay value and the fall time generic variable comprising at least one fall time delay value;

storing the at least one rise time delay value and the at least one fall time delay value according to a predetermined correlation policy;

removing at least one duplicate rise time delay value from the at least one rise time delay value; and removing at least one duplicate fall time delay value from the at least one fall time delay value.

2. The method of claim 1, wherein the rise time generic variable comprises the rise time delay value copied from the tuple, and wherein the fall time generic variable comprises the fall time delay value copied from the tuple.

3. The method of claim 1, wherein the correlation policy represents a correlation of occurrences of delay values in a VHDL standard delay file.

4. The method of claim 1, wherein method further comprises:

grouping, into at least one correlation set, one of
the at least one rise time delay value into a rise time delay correlation set; and
the at least one fall time delay value into a fall time delay correlation set.

5. The method of claim 1, wherein method further comprises:

sorting at least one set of
the at least one rise time delay value; and
the at least one fall time delay value.

6. The method of claim 1, further comprising:

collecting generic variables from a VHDL standard delay file;

selecting a generic variable; and extracting delay values for the selected generic variable.

7. The method of claim 1, further comprising:
grouping delay values into correlation sets, wherein each of the correlation sets comprises a group of delay values up to a predetermined maximum number of delay values.

8. The method of claim 7, wherein the predetermined maximum number of delay values in a group is 256.

9. The method of claim 1, wherein method further comprises:
outputting an analysis file based on the at least one rise time delay value and the at least one fall time delay value.

10. The method of claim 9, wherein the analysis file comprises a data structure comprising:
a first field containing an ISO 8859-1 character representing an index position in a correlation set; and
a set of fields, each field containing an ISO 8859-1 character representing a delay value position of a delay name in a VHDL logic gate model.

11. The method of claim 9, wherein the analysis file comprises a data structure comprising:
a set of fields, each field containing an ISO 8859-1 character indexing a set of slots containing positions for delay values of a delay name in a VHDL logic gate mode; and
a second set of fields, each field containing an ISO 8859-1 character indexing the position of the delay value within the indexed slot.

12. The method of claim 9, wherein the analysis file comprises a data structure comprising:
a set of fields, each field containing an ISO 8859-1 character representing a first digit of a delay value of a delay name in a VHDL logic gate model;
a second set of fields, each field containing an ISO 8859-1 character representing a second digit of a delay value of a delay name in a VHDL logic gate model; and
a third set of fields, each field containing an ISO 8859-1 character representing a third digit of a delay value of a delay name in a VHDL logic gate model.

13. The method of claim 12, wherein each delay value is evaluated as the sum of a 3-digit number and a predetermined offset value.

14. The method of claim 13, wherein the 3-digit number comprises a base 62 number represented by alphanumeric characters.

15. The method of claim 9, wherein the analysis file comprises a 3-dimensional variable array data structure wherein:
a z-axis of the data structure represents a set of common blocks for each logical topology of a VHDL logic gate;
an x-axis of the data structure represents a delay name for the gate topology; and
a y-axis of the data structure represents an actual delay value.

16. The method of claim 15, wherein the z-axis of the data structure represents a generic delay name common to a plurality of logic gates.

17. The method of claim 9, further comprising:
collecting delay values from a VHDL standard delay file according to a second predetermined correlation policy;
sorting the delay values;
removing duplicate delay values;
grouping the delay values into correlation sets;
outputting a second analysis file;
generating statistical data for the analysis file and the second analysis file; and
comparing the statistical data to determine which correlation policy is most efficient.

18. An apparatus for delay correlation analysis for VHDL modeling, comprising:
a controller/processor;
a data memory, communicatively coupled to the controller/processor, for storing a VHDL standard delay file; and
an SDF analyzer, communicatively coupled to the controller/processor and the data memory, for collecting delay values from the VHDL standard delay file by copying from each VHDL generic variable in the VHDL standard delay file a rise time delay value and a fall time delay value from a tuple of the VHDL generic variable, and for storing in the data memory a rise time generic variable and a fall time generic variable, the rise time generic variable comprising at least one rise time delay value and the fall time generic variable comprising at least one fall time delay value.

19. The apparatus of claim 18, wherein the SDF analyzer for organizing the rise time generic variable and the fall time generic variable in the data memory according to a predetermined correlation policy.

20. The apparatus of claim 19, wherein the SDF analyzer for
organizing the rise time generic variable in the data memory by sorting the at least one rise time delay value, removing any duplicate rise time delay value, and grouping the at least one rise time delay value into at least one correlation set, and for
organizing the fall time generic variable in the data memory by sorting the at least one fall time delay value, removing any duplicate fall time delay value, and grouping the at least one fall time delay value into at least one correlation set.

21. The apparatus of claim 18, wherein the rise time generic variable and the fall time generic variable are stored in an SDF analysis file in the data memory.

22. A system for delay correlation analysis for VHDL modeling, comprising:
a memory for storing a VHDL standard delay file; and
an SDF analyzer, communicatively coupled to the memory, for copying from each VHDL generic variable in the VHDL standard delay file a rise time delay value and a fall time delay value from a tuple of the VHDL generic variable, and for storing in the memory a rise time generic variable and a fall time generic variable, the rise time generic variable comprising at least one rise time delay value and the fall time generic variable comprising at least one fall time delay value, the at least one rise time delay value including the rise time delay value copied from the tuple of the VHDL generic variable in the VHDL standard delay file, and the at least one fall time delay value including the fall time delay value copied from the tuple of the VHDL generic variable in the VHDL standard delay file.

23. The system of claim 22, wherein the at least one rise time delay value being sorted, with any duplicate rise time delay value being removed, and organized according to a predetermined correlation policy, and wherein the at least one fall time delay value being sorted, with any duplicate fall time delay value being removed, and organized according to a predetermined correlation policy.

24. The system of claim 23, wherein the rise time generic variable and the fall time generic variable are stored in memory in an SDF analysis file.

25. A computer readable medium comprising computer instructions for delay correlation analysis for VHDL modeling by:
   copying a rise time delay value and a fall time delay value from a tuple of a VHDL generic variable;
   storing a rise time generic variable and a fall time generic variable, the rise time generic variable comprising at least one rise time delay value and the fall time generic variable comprising at least one fall time delay value; and
   storing the at least one rise time delay value and the at least one fall time delay value according to a predetermined correlation policy;
   removing at least one duplicate rise time delay value from the at least one rise time delay value; and
   removing at least one duplicate fall time delay value from the at least one fall time delay value.

26. The computer readable medium of claim 25, wherein the rise time generic variable comprises the rise time delay value copied from the tuple, and wherein the fall time generic variable comprises the fall time delay value copied from the tuple.

27. The computer readable medium of claim 25, wherein the correlation policy represents a correlation of occurrences of delay values in a VHDL standard delay file.

28. The computer readable medium of claim 25, further comprising computer instructions for:
   grouping, into at least one correlation set, one of
      the at least one rise time delay value into a rise time delay correlation set; and
      the at least one fall time delay value into a fall time delay correlation set.

29. The computer readable medium of claim 25, further comprising computer instructions for:
   sorting at least one set of
      the at least one rise time delay value; and
      the at least one fall time delay value.

30. The computer readable medium of claim 25, further comprising computer instructions for:
   collecting generic variables from a VHDL standard delay file;
   selecting a generic variable; and
   extracting delay values for the selected generic variable.

31. The computer readable medium of claim 25, further comprising computer instructions for:
   grouping delay values into correlation sets, wherein each of the correlation sets comprises a group of delay values up to a predetermined maximum number of delay values.

32. The computer readable medium of claim 31, wherein the predetermined maximum number of delay values in a group is 256.

33. The computer readable medium of claim 25, further comprising computer instructions for:
   outputting an analysis file based on the at least one rise time delay value and the at least one fall time delay value.

34. The computer readable medium of claim 33, wherein the analysis file comprises a data structure comprising:
   a first field containing an ISO 8859-1 character representing an index position in a correlation set; and
   a set of fields, each field containing an ISO 8859-1 character representing a delay value position of a delay name in a VHDL logic gate model.

35. The computer readable medium of claim 33, wherein the analysis file comprises a data structure comprising:
   a set of fields, each field containing an ISO 8859-1 character indexing a set of slots containing positions for delay values of a delay name in a VHDL logic gate model; and
   a second set of fields, each field containing an ISO 8859-1 character indexing the position of the delay value within the indexed slot.

36. The computer readable medium of claim 33, wherein the analysis file comprises a data structure comprising:
   a set of fields, each field containing an ISO 8859-1 character representing a first digit of a delay value of a delay name in a VHDL logic gate model;
   a second set of fields, each field containing an ISO 8859-1 character representing a second digit of a delay value of a delay name in a VHDL logic gate model; and
   a third set of fields, each field containing an ISO 8859-1 character representing a third digit of a delay value of a delay name in a VHDL logic gate model.

37. The computer readable medium of claim 36, wherein each delay value is evaluated as the sum of a 3-digit number and a predetermined offset value.

38. The computer readable medium of claim 37, wherein the 3-digit number comprises a base 62 number represented by alphanumeric characters.

39. The computer readable medium of claim 33, wherein the analysis file comprises a 3-dimensional variable array data structure wherein:
   a z-axis of the data structure represents a set of common blocks for each logical topology of a VHDL logic gate;
   an x-axis of the data structure represents a delay name for the gate topology; and
   a y-axis of the data structure represents an actual delay value.

40. The computer readable medium of claim 39, wherein the z-axis of the data structure represents a generic delay name common to a plurality of logic gates.

41. The computer readable medium of claim 33, further comprising instructions for:
   collecting delay values from a VHDL standard delay file according to a second predetermined correlation policy;
   sorting the delay values;
   removing duplicate delay values;
   grouping the delay values into correlation sets;
   outputting a second analysis file;
   generating statistical data for the analysis file and the second analysis file; and
   comparing the statistical data to determine which correlation policy is most efficient.

* * * * *

UNITED STATES PATENT AND TRADEMARK OFFICE
CERTIFICATE OF CORRECTION

PATENT NO. : 6,817,000 B2
DATED : November 9, 2004
INVENTOR(S) : Marvin J. Rich et al.

It is certified that error appears in the above-identified patent and that said Letters Patent is hereby corrected as shown below:

Column 11,
Line 13, from "VIIDL" to -- VHDL --

Column 15,
Line 12, from "VIIDL" to -- VHDL --

Column 17,
Line 25, from "mode" to -- model --

Signed and Sealed this

Fifteenth Day of February, 2005

JON W. DUDAS
*Director of the United States Patent and Trademark Office*